United States Patent
Kajigaya

(10) Patent No.: US 9,761,312 B1
(45) Date of Patent: Sep. 12, 2017

(54) FERAM-DRAM HYBRID MEMORY

(71) Applicant: Micron Technology, Inc., Boise, ID (US)

(72) Inventor: Kazuhiko Kajigaya, Saitama (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/071,961

(22) Filed: Mar. 16, 2016

(51) Int. Cl.
| | |
|---|---|
| *G11C 7/10* | (2006.01) |
| *G11C 14/00* | (2006.01) |
| *G11C 11/22* | (2006.01) |
| *G11C 11/4091* | (2006.01) |
| *G11C 11/4093* | (2006.01) |
| *G11C 11/4096* | (2006.01) |
| *G11C 7/22* | (2006.01) |

(52) U.S. Cl.
CPC ........ *G11C 14/0027* (2013.01); *G11C 7/1006* (2013.01); *G11C 7/1051* (2013.01); *G11C 7/1072* (2013.01); *G11C 7/1078* (2013.01); *G11C 7/22* (2013.01); *G11C 11/221* (2013.01); *G11C 11/2273* (2013.01); *G11C 11/4091* (2013.01); *G11C 11/4093* (2013.01); *G11C 11/4096* (2013.01)

(58) Field of Classification Search
CPC ....... G11C 7/1051; G11C 7/1078; G11C 7/22; G11C 7/1006; G11C 7/1072
USPC ........................................ 365/189.17, 189.05
See application file for complete search history.

(56) References Cited

U.S. PATENT DOCUMENTS

| | | | |
|---|---|---|---|
| 6,418,063 B1 | 7/2002 | Seitsinger et al. | |
| 6,671,204 B2* | 12/2003 | Im | G11C 7/1039 365/185.11 |
| 7,050,322 B2 | 5/2006 | Zambrano | |
| 7,317,636 B2* | 1/2008 | Ide | G11C 11/5628 365/185.09 |
| 8,427,891 B2 | 4/2013 | Best | |
| 9,367,246 B2* | 6/2016 | Frayer | G06F 3/061 |
| 2010/0023681 A1 | 1/2010 | Sinclair et al. | |

(Continued)

FOREIGN PATENT DOCUMENTS

| | | |
|---|---|---|
| JP | H03283176 A | 12/1991 |
| JP | H09008247 A | 1/1997 |

OTHER PUBLICATIONS

Meza et al., "Enabling Efficient and Scalable Hybrid Memories Using Fine-Granularity DRAM Cache Management" IEEE Computer Architecture Letters 2012; 4 pages.

(Continued)

*Primary Examiner* — Pho M Luu
(74) *Attorney, Agent, or Firm* — Holland & Hart LLP

(57) ABSTRACT

Methods, systems, and devices for operating a ferroelectric memory cell or cells are described. One method includes determining whether to access a first memory cell of a first memory cell array or a second memory cell of a second memory cell array, where a first digit line coupled to the first memory cell is coupled to a paging buffer register including a sense amplifier. The method further includes operating a transfer gate based at least in part on determining to read the second memory cell of the second memory cell array, where the transfer gate is configured to selectively couple a second digit line coupled to the second memory cell to the paging buffer register through the first digit line.

24 Claims, 20 Drawing Sheets

(56) References Cited

U.S. PATENT DOCUMENTS

2012/0151161 A1* 6/2012 Jung .................. G11C 29/82
                                                    711/161
2014/0185379 A1   7/2014 Kim
2014/0258606 A1*  9/2014 Nakanishi ......... G11C 11/40622
                                                    711/105
2015/0143034 A1   5/2015 Chinnaswamy et al.

OTHER PUBLICATIONS

Ramos et al., "Page Placement in Hybrid Memory Systems" Copyright 2011 ACM 978-1-1503-0102-2/11/05; 11 pages.
ISA/EPO, International Search Report and Written Opinion of the International Searching Authority, Int'l. Appl. No. PCT/US2017/022677, dated Jun. 13, 2017, Korean Intellectual Property Office, Seo-gu Daejeon, Republic of Korea.

* cited by examiner

FERAM-DRAM HYBRID MEMORY

BACKGROUND

The following relates generally to memory devices, and more specifically to a hybrid memory including a ferroelectric random access memory (FeRAM) array and a dynamic random access memory (DRAM) array.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), DRAM, synchronous dynamic RAM (SDRAM), FeRAM, magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile, such as the ability to store data without periodic refreshing, may be advantageous.

In some cases, a FeRAM may be operated at a speed and with a nonvolatile property similar to that of a DRAM. In these cases, however, the ferroelectric capacitors used in the memory cells of the FeRAM may suffer from fatigue as a result of repeated polarizations and inversions of the ferroelectric materials within the ferroelectric capacitors, resulting in a reduction of residual polarization. Also, when writing operations are continuously carried out in the same polarization direction, a shift in the hysteresis characteristic of a memory cell, referred to as an "in-print," may cause subsequent degradation in the rewriting characteristic of the memory cell. Compared to a DRAM, a FeRAM may therefore support fewer read-out and writing operations over its lifetime.

On the other hand, the ferroelectric capacitor of a FeRAM has a characteristic in which the ferroelectric characteristic by a residual polarization component and the paraelectric characteristic by a normal capacitor component are combined with each other, and by using only the paraelectric characteristic, without carrying out polarization inversion, the FeRAM may be operated similarly to a DRAM.

BRIEF DESCRIPTION OF THE DRAWINGS

Embodiments of the disclosure are described with reference to the following figures.

DETAILED DESCRIPTION

The disclosed techniques relate to a memory device having a plurality of memory cells (e.g., ferroelectric memory cells (hybrid RAM (HRAM) cells). Ferroelectric memory cells have an information storage capacitor having a ferroelectric film. In one embodiment, a first memory cell array (e.g., a first HRAM array) may be configured to operate in a volatile mode (e.g., as a DRAM array) and a second memory cell array (e.g., a second HRAM array) may be configured to operate in a non-volatile mode (e.g., as a FeRAM array) in a hybrid memory arrangement. The memory cells of the DRAM array and the FeRAM array may have the same cell structure; however, the cell plate voltages of the ferroelectric capacitors of the HRAM memory cells in the DRAM array may be set to VSS (or ground), so that read/write operations may be performed without inversion of polarization of the ferroelectric films of the ferroelectric capacitors in the DRAM array. Digit lines of the DRAM array may be coupled to sense amplifiers in a paging buffer. Digit lines of the FeRAM array may be selectively coupled to the sense amplifiers in the paging buffer register by transfer gates, and through the digit lines of the DRAM array, enabling the memory cells of the FeRAM array to be selectively coupled to (or decoupled from) the sense amplifiers. In this manner, the sense amplifiers of the paging buffer register may be shared by the memory cells of the DRAM array and the FeRAM array, but the memory cells of the FeRAM array may be selectively coupled to the sense amplifiers.

Aspects of the disclosure introduced above are further described below in the context of a memory device. Specific examples of a hybrid memory are then described. These and other aspects of the disclosure are further illustrated by and described with reference to apparatus diagrams, system diagrams, and flowcharts that relate to the configuration, operation, and use of a hybrid memory.

Figure 1:
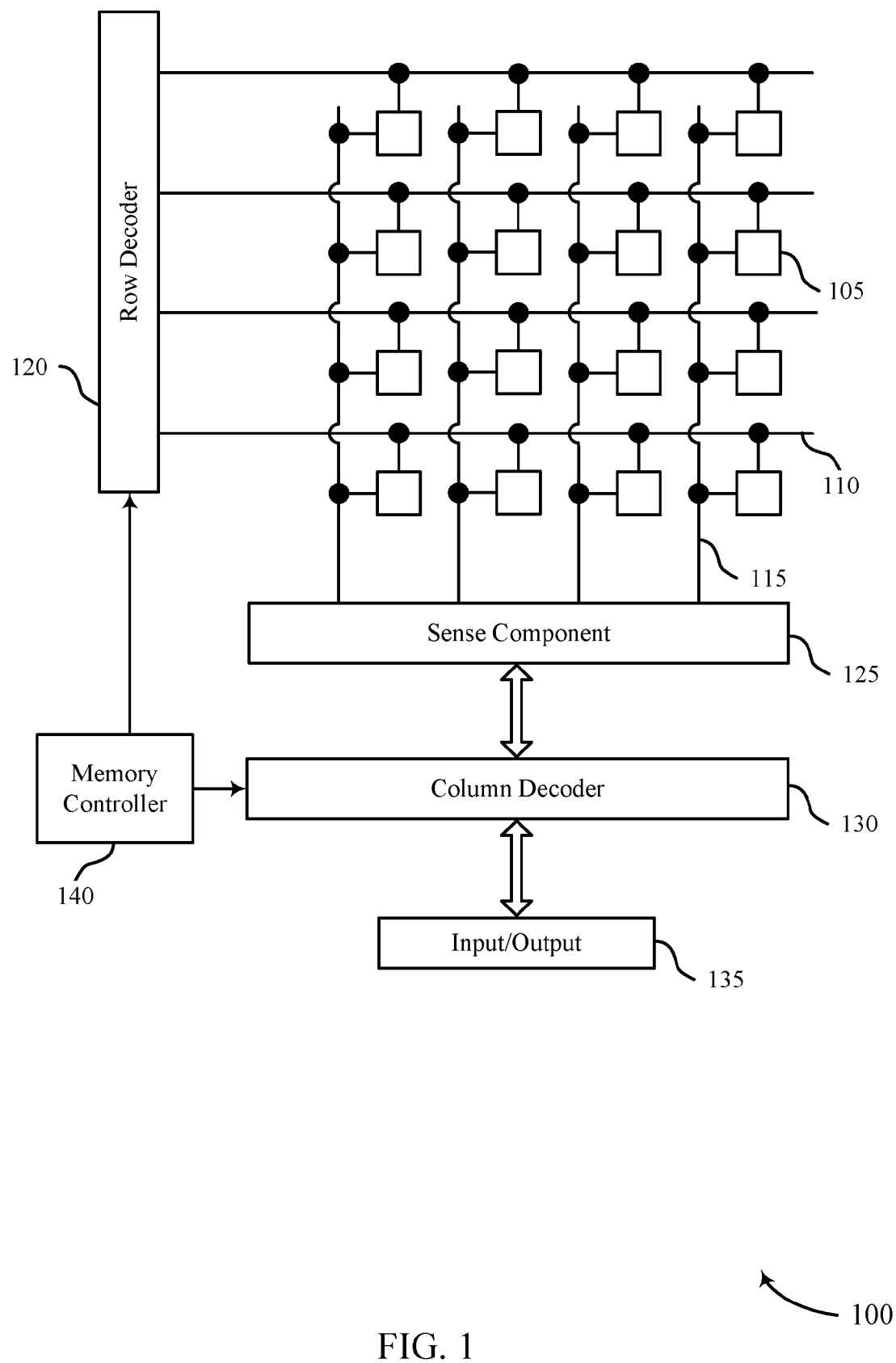
FIG. 1 illustrates an example memory device, in accordance with various embodiments.

FIG. 1 illustrates an example memory device 100, in accordance with various embodiments. The memory device 100 may include memory cells 105 that are programmable to store different states. Each memory cell 105 may be programmable to store two states, denoted a logic 0 and a logic 1. In some cases, a memory cell 105 may be configured to store more than two logic states. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Ferroelectric materials have non-linear polarization properties.

Operations such as reading and writing may be performed on the memory cells 105 by activating or selecting the appropriate access line 110 and digit line 115. Activating or selecting an access line 110 or a digit line 115 may include applying a voltage potential to the respective line. In some cases, an access line 110 may be referred to as a word line, or a digit line 115 may be referred to as a bit line. Word lines 110 and digit lines 115 may be made of conductive materials. In some examples, the word lines 110 and digit lines 115 may be made of metals (e.g., copper, aluminum, gold, tungsten, etc.). Each row of memory cells 105 may be connected to a single word line 110, and each column of memory cells 105 may be connected to a single digit line 115. By activating one word line 110 and one digit line 115, a single memory cell 105 may be accessed at their intersection. The intersection of an access line 110 and a digit line 115 may be referred to as an address of a memory cell.

In some architectures, the logic storing device of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activate the appropriate digit line 115. Thus, by activating an access line 110 and a digit line 115, a memory cell 105 may be accessed.

Upon accessing, a memory cell 105 may be read, or sensed, by the sense component 125. For example, the sense component 125 may compare a signal, e.g., a voltage, of the relevant digit line 115 to a reference signal (not shown) in order to determine the stored state of the memory cell 105. For example, if digit line 115 has a higher voltage than the reference voltage, then sense component 125 may determine that the stored state in memory cell 105 is a logic 1 and vice versa. The sense component 125 may include various transistors or amplifiers in order to detect and amplify a difference in the signals, which may be referred to as latching. The detected logic state of a memory cell 105 may then be output through column decoder 130 as output 135.

A memory cell 105 may be set, or written, by similarly activating the relevant word line 110 and digit line 115. As discussed above, activating an access line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. The column decoder 130 may accept data, for example input 135, to be written to the memory cells 105. In the case of a ferroelectric capacitor, a memory cell 105 may be written by applying a voltage across the ferroelectric capacitor.

In some memory architectures, accessing the memory cell 105 may degrade or destroy the stored logic state, and re-write or refresh operations may be performed to return the original logic state to memory cell 105. In a DRAM, for example, the capacitor may be partially or completely discharged during a sense operation, corrupting the stored logic state. A stored logic state may therefore be re-written after a sense operation. Additionally, activating a single word line 110 may result in the discharge of all memory cells in the row; and thus, all memory cells 105 in the row may need to be re-written.

Some memory architectures, including DRAM architectures, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells can have beneficial properties that may result in improved performance relative to other memory architectures.

The memory controller 140 may control the operation (read, write, re-write, refresh, etc.) of memory cells 105 through the various components, for example, the row decoder 120, the column decoder 130, and the sense component 125. The memory controller 140 may generate row and column address signals in order to activate the desired word line 110 and digit line 115. The memory controller 140 may also generate and control various voltage potentials used during the operation of the memory device 100. In general, the amplitude, shape, or duration of an applied voltage discussed herein may be adjusted or varied and may be different for the various operations discussed in operating the memory device 100. Furthermore, one, multiple, or all of the memory cells 105 within the memory device 100 may be accessed simultaneously. For example, multiple or all cells of the memory device 100 may be accessed simultaneously during a reset operation in which all of the memory cells 105, or a group of the memory cells 105, are set to a single logic state.

In some examples of the memory device 100, the memory cells 105 may be laid out in banks and arrays. For example, the memory cells 105 may be laid out in an 8-bank configuration, with each of the banks being selectable by a bank address. Row decoders may be disposed as two rows in a longitudinal direction in the center portion of each bank, with a column decoder being disposed in a lateral direction in the center portion. Arrays 0 to 3 may be disposed in four regions divided by the row decoders and the column decoder. Each array may be divided into blocks (e.g., 16 blocks). Block 0 of an array may be divided into two portions, with one portion being disposed at each end of the array. In some examples, each block may be selected by a block address constituted by 6 bits in a row address.

An array control circuit may receive a row address and transmit the row address to a block selected by a block address. Moreover, the array control circuit may also transmit a region control signal (TG) to each of the blocks. A row of sense amplifiers (of the sense component 125), each of which sense-amplifies a signal read from a memory cell onto a digit line may be disposed between adjacent blocks. To the sense amplifier row, a control signal for controlling the sense amplifiers within the row may be inputted. Exemplary configurations of a block are described with reference to FIGS. 4, 5, 11, 16, and 17.

A column address may be inputted to the column decoder 130 so that a column selection line YS is selected. For example, when 8 YS lines are selected, 64 sense amplifiers within the sense amplifier rows selected by an active command, and 64 pairs of IO paired lines, may be selectively connected with each other. Read-out data and write data of memory cells 105 of 64 bits, serving as the access subjects, may be transferred and received to and from the sense component 125 through the IO paired lines. A parallel/serial converting circuit may be installed between the sense component 125 and the data input/output buffers 135, and a conversion process from parallel data of 64 bits to serial data having burst lengths of 8 with a 8-bit width may be carried out in accordance with the column address (e.g., 3 bits).

Figure 2:
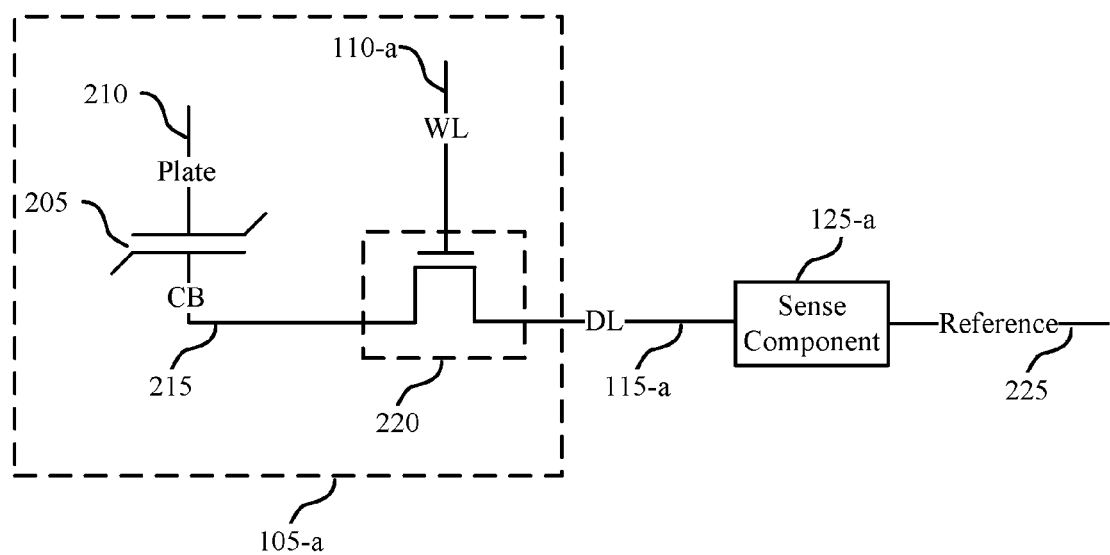
FIG. 2 illustrates an example memory device, in accordance with various embodiments.

FIG. 2 illustrates an example memory device 200, in accordance with various embodiments. The memory device 200 may include a ferroelectric memory cell 105-a, an access line 110-a, a digit line 115-a, and a sense component 125-a, which may be examples of a memory cell 105, word line 110, digit line 115, and sense component 125, respectively, described with reference to FIG. 1. The memory device 200 may include a logic storage component, such as capacitor 205 that includes two conductive terminals, a cell plate (CP) 210, and a cell bottom (CB) 215. These terminals may be separated by an insulating ferroelectric material. As described above, various states may be stored by charging or discharging capacitor 205.

The stored state of the capacitor 205 may be read or sensed by operating various elements represented in the memory device 200. The capacitor 205 may be in electronic communication with the digit line 115-a. The capacitor 205 may thus be isolated from the digit line 115-a when the selection component 220 is deactivated, and the capacitor 205 may be connected to the digit line 115-a via the selection component 220 when the selection component 220 is activated. In some cases, the selection component 220 may be a transistor (e.g., an nMOS transistor) and its operation may be controlled by applying a voltage to the transistor gate, where the voltage magnitude is greater than the threshold magnitude of the transistor. The word line 110-a may activate the selection component 220; for example, a voltage applied to word line 110-a may be applied to the transistor gate, connecting the capacitor 205 with the digit line 115-a.

In the example depicted in FIG. 2, the capacitor 205 is a ferroelectric capacitor. Due to the ferroelectric material between the plates of the capacitor 205, the capacitor 205 may not discharge upon connection to the digit line 115-a. Instead, the cell plate 210 may be biased by an external voltage, resulting in a change in the stored charge on the capacitor 205. The change in stored charge depends on the initial state of the capacitor 205, i.e., if the initial stored state is a logic 1 or a logic 0. The change in stored charge may be compared to a reference (e.g., a reference voltage) by the sense component 125-a in order to determine the stored logic state in the memory cell 105-a.

The specific sensing scheme or process may take many forms. In one example, the digit line 115-a may have an intrinsic capacitance and develop a non-zero voltage as the capacitor 205 charges or discharges in response to the voltage applied to the cell plate 210. The intrinsic capacitance may depend on physical characteristics, including the dimensions, of the digit line 115-a. The digit line 115-a may connect many memory cells 105, so the digit line 115-a may have a length that results in a non-negligible capacitance (e.g., on the order of pF). The subsequent voltage of the digit line 115-a may depend on the initial logic state of the capacitor 205, and the sense component 125-a may compare this voltage to a reference voltage.

To write the memory cell 105-a, a voltage potential may be applied across the capacitor 205. Various methods may be used. In one example, the selection component 220 may be activated through the word line 110-a in order to electrically connect the capacitor 205 to the digit line 115-a. A voltage may be applied across the capacitor 205 by controlling the voltage of the cell plate 210 and the cell bottom 215, through the digit line 115-a. To write a logic 1, the cell plate 210 may be driven high, that is, a positive voltage may be applied, and the cell bottom 215 may be driven low, i.e., connected to ground, virtually grounded, or a negative voltage may be applied. The opposite may be performed to write a logic 0, i.e., the cell plate 210 may be driven low and the cell bottom 215 may be driven high.

Figure 3:
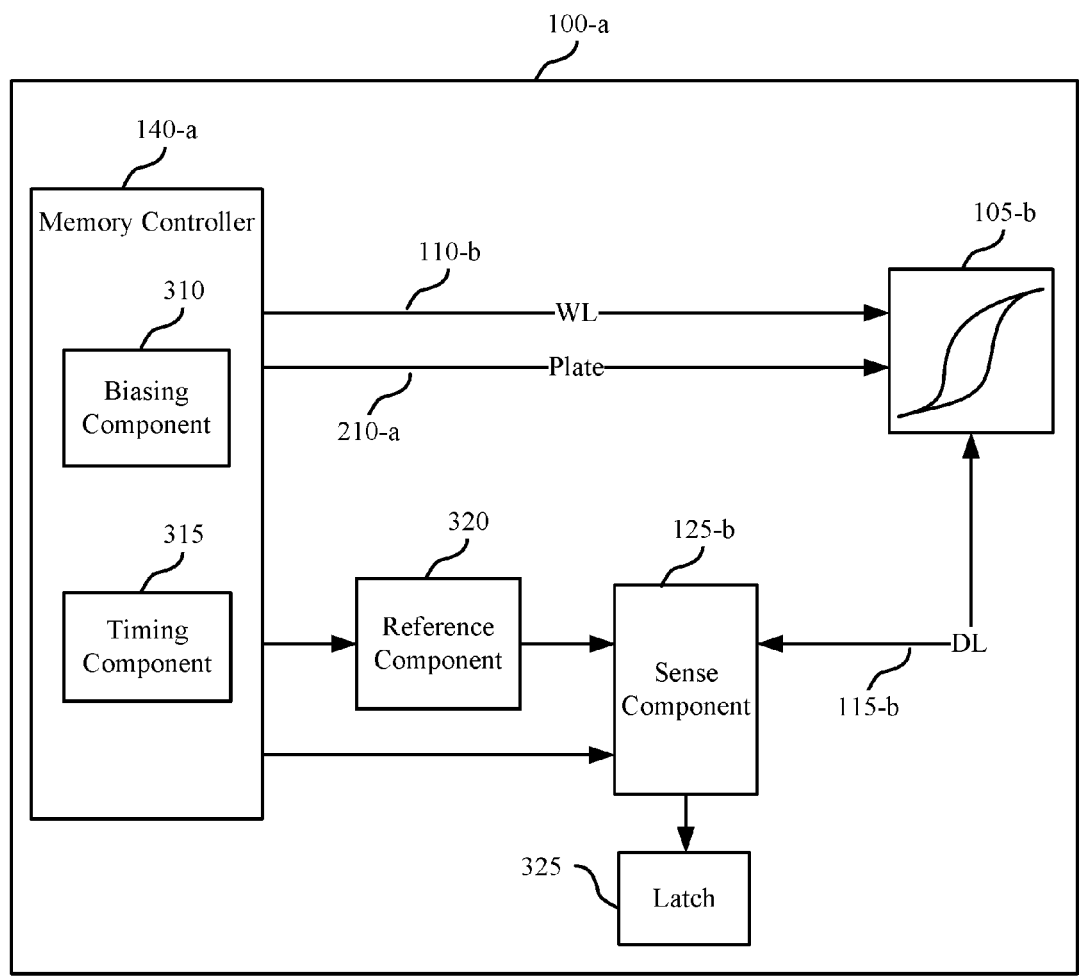
FIG. 3 shows a block diagram of a memory device, in accordance with various embodiments.

FIG. 3 shows a block diagram 300 of a memory device 100-a, in accordance with various embodiments. The memory device 100-a may contain a memory controller 140-a and memory cell 105-b, which may be examples of the memory controller 140 and memory cell 105 described with reference to FIGS. 1 and 2. The memory controller 140-a may include a biasing component 310 and a timing component 315 and may operate the memory device 100-a as described in one or more of FIGS. 1 and 2. The memory controller 140-a may be in electronic communication with an access line 110-b, a digit line 115-b, a sense component 125-b, and a cell plate 210-a, which may be examples of the word line 110, digit line 115, sense component 125, and cell plate 210 described with reference to FIGS. 1 and 2. The memory device 100-a may also include a reference component 320 and a latch 325. The components of the memory device 100-a may be in electronic communication with each other and may perform the functions described with reference to one or more of FIGS. 1 and 2. In some cases, the reference component 320, the sense component 125-b, and the latch 325 may be components of the memory controller 140-a.

The memory controller 140-a may be configured to activate the word line 110-b, the cell plate 210-a, or the digit line 115-b by applying voltages to these various nodes. For example, the biasing component 310 may be configured to apply a voltage to operate the memory cell 105-b (e.g., to read or write the memory cell 105-b) as described with reference to FIGS. 1 and 2. In some cases, the memory controller 140-a may include a row decoder, a column decoder, or both, as described with reference to FIG. 1. This may enable the memory controller 140-a to access one or more memory cells 105-b. The biasing component 310 may also provide voltage potentials to the reference component 320 in order to generate a reference signal for the sense component 125-b. Additionally, the biasing component 310 may provide voltage potentials for operation of the sense component 125-b.

In some cases, the memory controller 140-a may perform its operations using the timing component 315. For example, the timing component 315 may control the timing of the various word line selections or cell plate biasing, including the timing of switching functions and voltage applications to perform the memory functions, such as reading and writing, described herein. In some cases, the timing component 315 may control the operations of the biasing component 310.

The reference component 320 may include various components to generate a reference signal for the sense component 125-b. The reference component 320 may include circuitry specifically configured to produce a reference signal. In some cases, the reference component 320 may include other ferroelectric memory cells. In some examples, the reference component 320 may be configured to output a voltage with a value between two sense voltages, or the reference component 320 may be designed to output a virtual ground voltage.

The sense component 125-b may compare a signal from the memory cell 105-b (received through the digit line 115-b) with a reference signal from the reference component 320. Upon determining the logic state, the sense component 125-b may store the logic state in a latch 325, where it may be used in accordance with the operations of an electronic device using the apparatus of which the memory device 100-a is a part.

Figure 4:
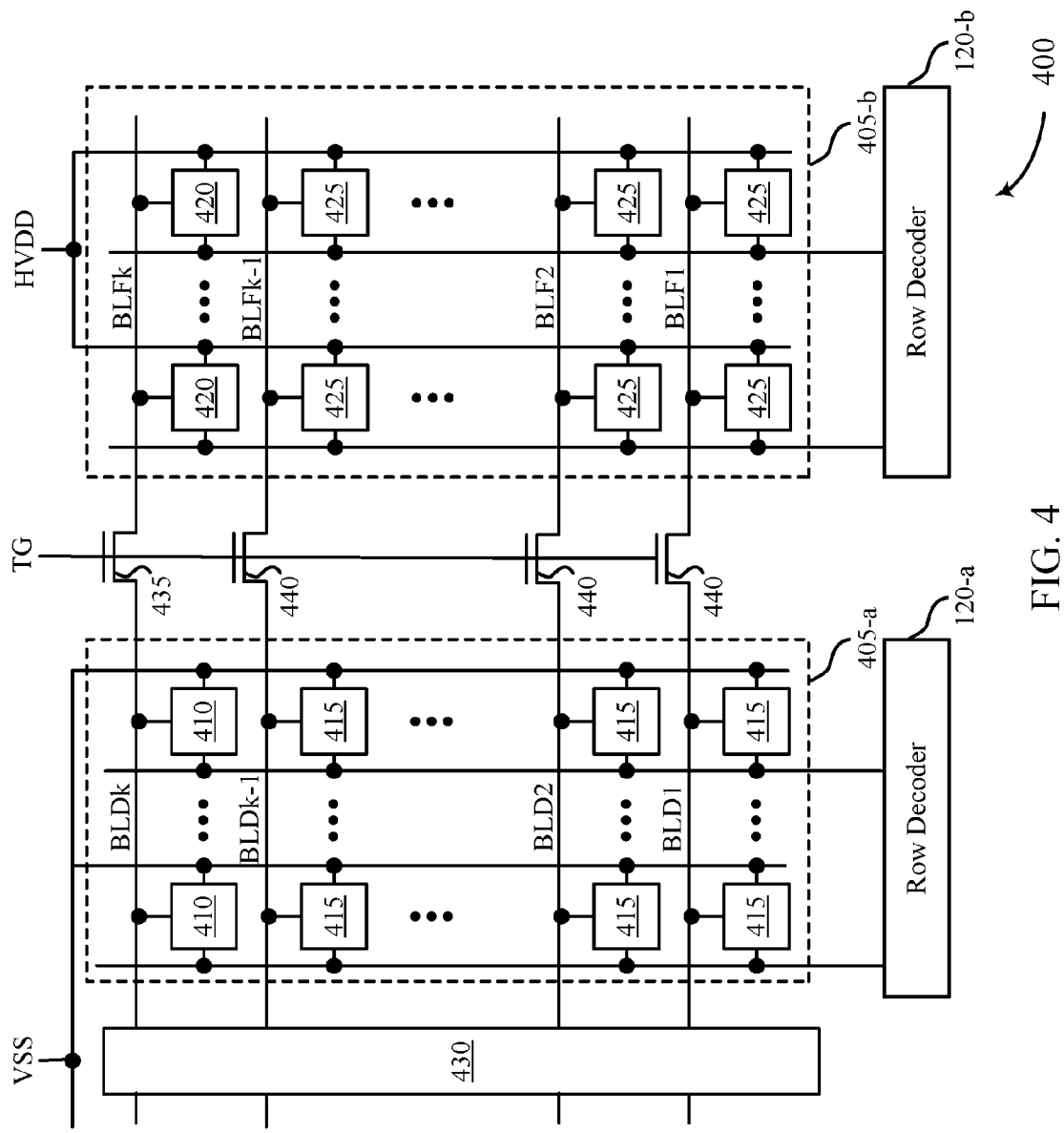
FIG. 4 illustrates a first example of an apparatus including a hybrid memory, in accordance with various embodiments.

FIG. 4 illustrates a first example of an apparatus 400 including a hybrid memory, in accordance with various embodiments. The apparatus 400 may include a first memory cell array 405-a and a second memory cell array 405-b. In some examples, the apparatus 400 may be an example of aspects of one block of the memory devices 100 described with reference to FIGS. 1 and 3.

The first memory cell array 405-a may include a plurality of memory cells, including a first plurality of memory cells 410 connected to a first digit line (e.g., digit line BLDk). The first memory cell array 405-a may also include other memory cells 415 connected to other digit lines (e.g., digit lines BLD1, BLD2, BLDk−1, etc.). The second memory cell array 405-b may also include a plurality of memory cells, including a second plurality of memory cells 420 connected to a second digit line (e.g., digit line BLFk). The second memory cell array 405-b may also include other memory cells 425 connected to other digit lines (e.g., digit lines BLF1, BLF2, BLFk−1, etc.). In some examples, some or all of the memory cells 410, 415, 420, and/or 425 included in the first memory cell array 405-a or the second memory cell array 405-b may be examples of aspects of the memory cells 105 described with reference to FIGS. 1, 2, and 3.

Each digit line of the first memory cell array 405-a may be coupled to a respective sense amplifier in a paging buffer register 430. Each digit line of the second memory cell array 405-b may be selectively coupled to a respective sense amplifier in the paging buffer register 430 through a digit line of the first memory cell array 405-a. For example, a first transfer gate 435 (e.g., an nMOS transistor) may have source and drain terminals coupled, respectively, to the first digit line (BLDk) and the second digit line (BLFk). A region control signal (TG) applied to the gate terminal of the first transfer gate 435 may be operate the first transfer gate 435 to open the first transfer gate 435 and decouple the second digit line from the first digit line, or close the first transfer gate 435 and couple the second digit line to the first digit line. When the first transfer gate 435 is closed, data may be read or written from the second plurality of memory cells 420, or transferred between memory cells of the first plurality of memory cells 410 and the second plurality of memory cells 420. Other transfer gates 440 may be used to selectively couple other digit lines of the second memory cell array 405-b to digit lines of the first memory cell array 405-a.

The sense amplifiers within the paging buffer register 430 may be shared by the first memory cell array 405-a and the second memory cell array 405-b. For example, the first digit line (BLDk) may be coupled to a first sense amplifier, and when the first transfer gate 435 is closed, the second digit line (BLFk) may be coupled to the first sense amplifier through the first digit line.

In some examples, the first memory cell array 405-a may include fewer memory cells than the second memory cell array 405-b, and the first plurality of memory cells 410 may include fewer memory cells than the second plurality of memory cells 420. In the same or different examples, the first memory cell array 405-a may include a first plurality of ferroelectric memory cells, and the second memory cell array 405-b may include a second plurality of ferroelectric memory cells. In some examples, the first plurality of ferroelectric memory cells may be configured to operate in a volatile mode (e.g., the first plurality of ferroelectric memory cells or first memory cell array 405-a may be configured to operate as a DRAM). When the first memory cell array 405-*a* is operated as a DRAM, the cell plates of the memory cells 410, 415 included in the first memory cell array 405-*a* may be connected to a first common voltage rail and set to the voltage VSS. In some examples, the second plurality of ferroelectric memory cells may be configured to operate in a non-volatile mode (e.g., the second plurality of ferroelectric memory cells or second memory cell array 405-*b* may be configured to operate as a FeRAM). When the second memory cell array 405-*b* is operated as a FeRAM, the cell plates of the memory cells 420, 425 included in the second memory cell array 405-*b* may be connected to a second common voltage rail and set to the voltage HVDD (or VDD/2).

A memory cell within the first memory cell array 405-*a* or the second memory cell array 405-*b* may be addressed (or accessed) by applying appropriate voltages to one or more digit lines, via the column decoder 130-*a*, and to one or more word lines, via the row decoder 120-*a* or row decoder 120-*b*.

In some examples, the first memory cell array 405-*a* and the second memory cell array 405-*b* may be provided on a same conductor chip.

Figure 5:
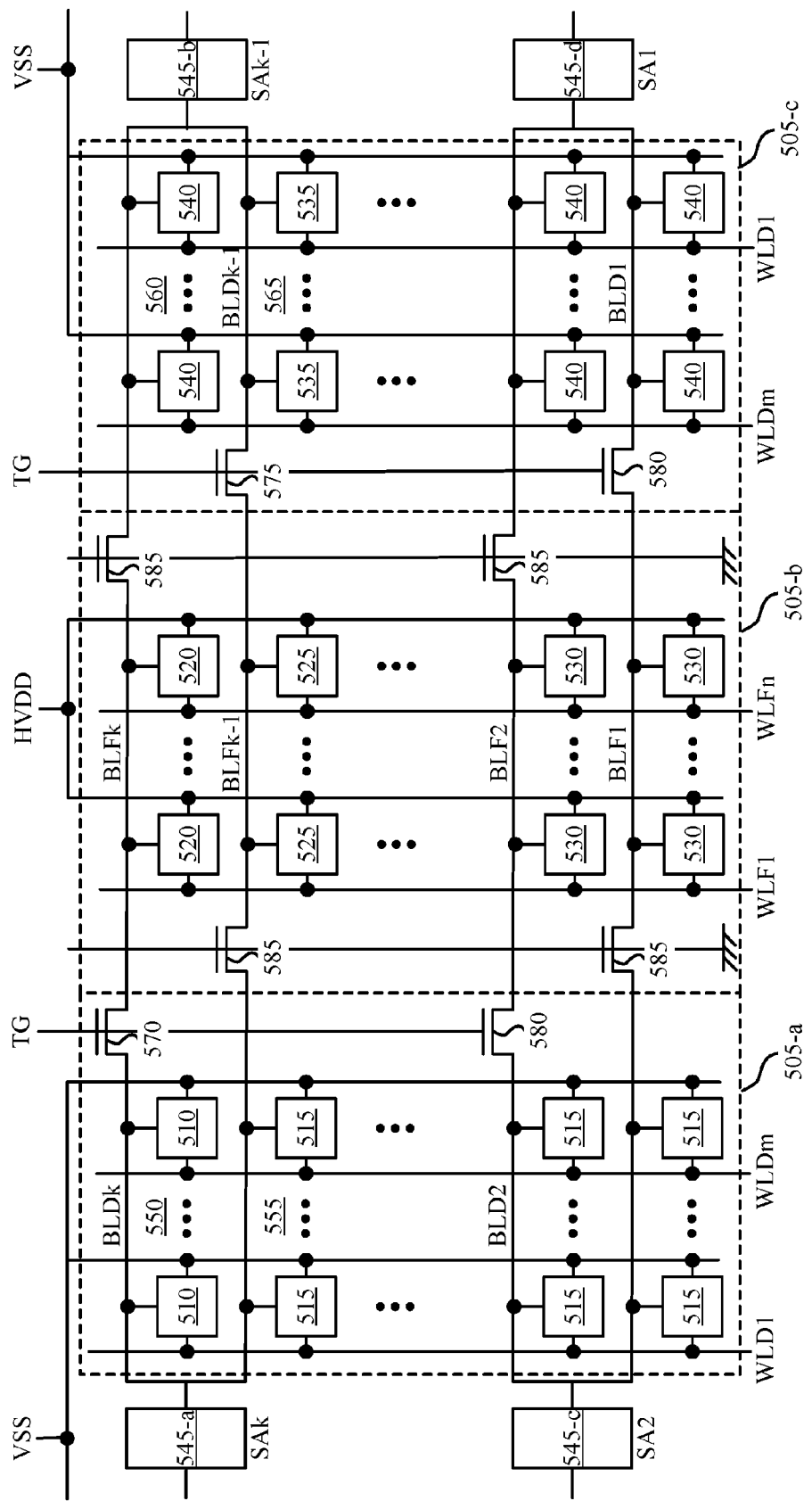
FIG. 5 illustrates a second example of an apparatus including a hybrid memory, in accordance with various embodiments.

FIG. 5 illustrates a second example of an apparatus 500 including a hybrid memory, in accordance with various embodiments. The apparatus 500 may include a first memory cell array 505-*a*, a second memory cell array 505-*b*, and a third memory cell array 505-*c*. The second memory cell array 505-*b* may be positioned between the first memory cell array 505-*a* and the third memory cell array 505-*c*. In some examples, the apparatus 500 may be an example of aspects of one block of the memory device described with reference to FIG. 1.

The first memory cell array 505-*a* may include a plurality of memory cells, including a first plurality of memory cells 510 connected to a first digit line (e.g., digit line BLDk). The first memory cell array 505-*a* may also include other memory cells 515 connected to other digit lines (e.g., digit line BLD2, etc.). The second memory cell array 505-*b* may also include a plurality of memory cells, including a second plurality of memory cells 520 connected to a second digit line (e.g., digit line BLFk), and a third plurality of memory cells 525 connected to a third digit line (e.g., digit line BLFk−1). The second memory cell array 505-*b* may also include other memory cells 530 connected to other digit lines (e.g., digit lines BLF1, BLF2, etc.). The third memory cell array 505-*c* may include a plurality of memory cells, including a fourth plurality of memory cells 535 connected to a fourth digit line (e.g., digit line BLDk−1). The third memory cell array 505-*c* may also include other memory cells 540 connected to other digit lines (e.g., digit line BLD2, etc.). In some examples, some or all of the memory cells 510, 515, 520, 525, 530, 535, and/or 540 included in the first memory cell array 505-*a*, the second memory cell array 505-*b*, or the third memory cell array 505-*c* may be examples of aspects of the memory cells 105 described with reference to FIGS. 1, 2, and 3.

The first memory cell array 505-*a* may include k/2 digit lines, identified as even digit lines BLD2 through BLDk. The third memory cell array 505-*c* may include a second set of k/2 digit lines, identified as odd digit lines BLD1 through BLDk−1. Each digit line of the first memory cell array 505-*a* and the third memory cell array 505-*c* may be coupled to a respective sense amplifier in a paging buffer register (e.g., to an input terminal of one of a plurality of sense amplifiers including a first sense amplifier (SAk or 545-*a*), a second sense amplifier (SAk−1 or 545-*b*), a third sense amplifier (SA2 or 545-*c*), and a fourth sense amplifier (SA1 or 545-*d*).

Each of the digit lines in the first memory cell array 505-*a* and the third memory cell array 505-*c* may be connected to an input terminal of a respective sense amplifier in a folded back arrangement. For example, the first plurality of memory cells may include a first subset of memory cells 550 coupled to the first digit line (BLDk−1) and a second subset of memory cells 555 coupled to the first digit line, and the first digit line may be coupled to an input terminal of the first sense amplifier 545-*a* between the first subset of memory cells 550 and the second subset of memory cells 555. Similarly, the fourth plurality of memory cells may include a first subset of memory cells 560 coupled to the fourth digit line (BLDk) and a second subset of memory cells 565 coupled to the fourth digit line, and the fourth digit line may be coupled to an input terminal of the second sense amplifier 545-*b* between the first subset of memory cells 560 and the second subset of memory cells 565.

Each digit line of the second memory cell array 505-*b* may be selectively coupled to an input terminal of a respective sense amplifier in the paging buffer register through a digit line of the first memory cell array 505-*a* or the third memory cell array 505-*c*. For example, a first transfer gate 570 (e.g., an nMOS transistor) may have source and drain terminals coupled, respectively, to the first digit line (BLDk) and the second digit line (BLFk). A region control signal (TG) applied to the gate terminal of the first transfer gate 570 may be operate the first transfer gate 570 to open the first transfer gate 570 and decouple the second digit line from the first digit line, or close the first transfer gate 570 and couple the second digit line to the first digit line. When the first transfer gate 570 is closed, data may be read or written from the second plurality of memory cells 520, or transferred between memory cells of the first plurality of memory cells 510 and the second plurality of memory cells 520. A second transfer gate 575 (e.g., an nMOS transistor) may have source and drain terminals coupled, respectively, to the third digit line (BLFk−1) and the fourth digit line (BLDk−1). A region control signal (TG) applied to the gate terminal of the second transfer gate 575 may be operate the second transfer gate 575 to open the second transfer gate 575 and decouple the third digit line from the fourth digit line, or close the second transfer gate 575 and couple the third digit line to the fourth digit line. When the second transfer gate 575 is closed, data may be read or written from the third plurality of memory cells 525, or transferred between memory cells of the third plurality of memory cells 525 and the fourth plurality of memory cells 535. Other transfer gates 580 may be used to selectively couple other digit lines of the second memory cell array 505-*b* to digit lines of the first memory cell array 505-*a* or the third memory cell array 505-*c*.

In some examples, each digit line of the first memory cell array 505-*a* (e.g., each even-numbered BLD digit line) may be separated from an odd-numbered digit line (e.g., a BLF digit line) of the second memory cell array 505-*b* by an isolation transistor 585 (e.g., an nMOS transistor) coupled to the two digit lines by its source and drain terminals and having a gate terminal connected to ground. For example, a first isolation transistor 585 is coupled between the first digit line (BLDk) and the third digit line (BLFk−1). Similarly, each digit line of the third memory cell array 505-*c* (e.g., each odd-numbered BLD digit line) may be separated from an even-numbered digit line (e.g., a BLF digit line) of the second memory cell array 505-*b* by an isolation transistor 585 (e.g., an nMOS transistor) coupled to the two digit lines by its source and drain terminals and having a gate terminal connected to ground. For example, a second isolation transistor 585 is coupled between the fourth digit line (BLDk−1) and the second digit line (BLFk).

Each sense amplifier within the paging buffer register may be shared by the first memory cell array 505-*a* and the second memory cell array 505-*b*, or by the second memory cell array 505-*b* and the third memory cell array 505-*c*.

In some examples, each of the first memory cell array 505-*a* and the third memory cell array 505-*c* may include fewer memory cells than the second memory cell array 505-*b*, and each of the first plurality of memory cells 510 and the fourth plurality of memory cells 535 may include fewer memory cells than each of the second plurality of memory cells 520 and the third plurality of memory cells 525. In the same or different examples, each of the first memory cell array 505-*a* and the third memory cell array 505-*c* may include a first plurality of ferroelectric memory cells, and the second memory cell array 505-*b* may include a second plurality of ferroelectric memory cells. In some examples, the first plurality of ferroelectric memory cells may be configured to operate in a volatile mode (e.g., the first plurality of ferroelectric memory cells or first and third memory cell arrays 505-*a*, 505-*c* may be configured to operate as a k×m DRAM). When the first and third memory cell arrays 505-*a*, 505-*c* are operated as a DRAM, the cell plates of the memory cells 510, 515, 535, and 540 included in the first and third memory cell arrays 505-*a*, 505-*c* may be connected to a first common voltage rail and set to the voltage VSS. In some examples, the second plurality of ferroelectric memory cells may be configured to operate in a non-volatile mode (e.g., the second plurality of ferroelectric memory cells or second memory cell array 505-*b* may be configured to operate as a k×n FeRAM). When the second memory cell array 505-*b* is operated as a FeRAM, the cell plates of the memory cells 520, 525, and 530 included in the second memory cell array 505-*b* may be connected to a second common voltage rail and set to the voltage HVDD (or VDD/2).

A memory cell within the first memory cell array 505-*a*, the second memory cell array 505-*b*, or the third memory cell array 505-*c* may be addressed (or accessed) by applying appropriate voltages to one or more digit lines (e.g., using a column decoder) and to one or more word lines (e.g., using a row decoder). By way of example, FIG. 5 shows a first plurality of word lines (e.g., WLD1, WLDm, etc.) for addressing the first and third memory cell arrays 505-*a*, 505-*c*, and a second plurality of word lines (e.g., WLF1, WLFn, etc.) for addressing the second memory cell array 505-*b*. When the first memory cell array 505-*a* and the third memory cell array 505-*c* are operated as a DRAM, each word line in the first plurality of word lines may be coupled to a first memory cell in the first subset of memory cells 550 and a second memory cell in the second subset of memory cells 555 (representing a first bit of a k×m DRAM array), to a third memory cell in the first subset of memory cells 560 and a fourth memory cell in the second subset of memory cells 565, and to other memory cells of the first memory cell array 505-*a* and the third memory cell array 505-*c*. In some examples, each of the word lines in the first plurality of word lines (e.g., WLD1, WLDm, etc.) may be a logical word line representing a pair of physical word lines—e.g., the logical word line WLD1 may include a first physical word line for addressing the first memory cell array 505-*a*, and a second physical word line for addressing the third memory cell array 505-*c*. In some examples, the number of word lines in the first set of word lines and the number of word lines in the second set of word lines may be optimized relative to the amount of read-out signal, or optimized relative to an application.

In operation, a set of memory cells in the first memory cell array 505-*a* or the third memory cell array 505-*c* may be accessed by driving the region control signal TG low, to open the transfer gates 570, 575, and 580 and isolate the digit lines of the second memory cell array 505-*b* from the digit lines of the first memory cell array 505-*a* and the third memory cell array 505-*c*. One of word lines WLD may then be asserted to select a set of memory cells of the first memory cell array 505-*a* and/or the third memory cell array 505-*c*. As a result, a sufficient read-out signal voltage is obtained even at the time of the DRAM operation in which the amount of a signal charge is small so that the operation margin is improved. Moreover, in the present embodiment, two memory cells are connected to the digit line in parallel with each other at the time of the DRAM operation. As a result, although no great increase is obtained in terms of the read-out signal voltage, by connecting the two memory cells in parallel with each other, there is less probability in which leakages become large simultaneously in both of the capacitors, with respect to the leakage of the charge of the capacitors which causes a problem at the time of the DRAM operation; therefore, the margin against the leakage is improved.

A memory cell in the second memory cell array 505-*b* may be accessed by driving the region control signal TG high, to close the transfer gates 570, 575, and 580 and couple the digit lines of the second memory cell array 505-*b* to digit lines of the first memory cell array 505-*a* and the third memory cell array 505-*c*. One of word lines WLF may then be asserted to select a set of memory cells of the second memory cell array 505-*b*. Since there is neither 1) a case in which the amount of signal charge due to a residual polarization becomes better in the second memory cell array 505-*b* (e.g., during FeRAM operation) or the first or third memory cell arrays 505-*a*, 505-*c* (e.g., during DRAM operation), nor 2) a case in which the parasitic capacitance of the digit line becomes as small as possible when operating the second memory cell array 505-*b* (e.g., during FeRAM operation) or the first or third memory cell arrays 505-*a*, 505-*c* (e.g., during DRAM operation), no problem arises when the digit line capacitance is increased by passing data from/to a memory cell of the second memory cell array 505-*b* through digit lines of the first or third memory cell arrays 505-*a*, 505-*c*. The capacitances of digit lines in the first and third memory cell arrays 505-*a*, 505-*c* may therefore be optimized for DRAM operation, and the capacitances of digit lines in the second memory cell array 505-*b* may be optimized for FeRAM operation.

In some examples, the first memory cell array 505-*a*, the second memory cell array 505-*b*, and the third memory cell array 505-*c* may be provided on a same conductor chip.

Figure 6:
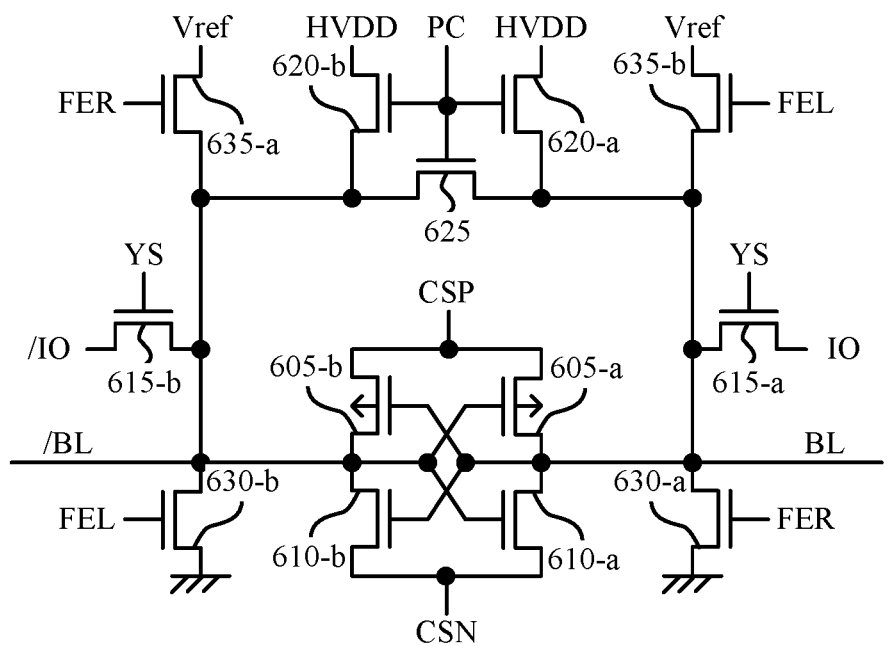
FIG. 6 illustrates a first example of a sense amplifier, in accordance with various embodiments.

FIG. 6 illustrates a first example of a sense amplifier 600, in accordance with various embodiments. In some examples, the sense amplifier 600 may be an example of aspects of one of the sense amplifiers 545 described with reference to FIG. 5. In some examples, the sense amplifier 600 may include a sensing circuit that compares signals on digit lines BL and /BL, where /BL is a complimentary digit line to BL. By way of example, the sensing circuit may include a set of four transistors, including two pMOS transistors 605-*a*, 605-*b* and two nMOS transistors 610-*a*, 610-*b*. The sense amplifier 600 may also include a pair of transistors (e.g., nMOS transistors 615-*a* and 615-*b*) for respectively coupling BL or /BL to an I/O register (10). The transistors 615-a and 615-b may have gate terminals driven by the column decoder selection signal YS.

The sense amplifier 600 may include a first circuit operable to bias BL to a first voltage (e.g., HVDD) prior to reading from a first memory cell array (e.g., a DRAM array configured similarly to the memory cell array 505-a described with reference to FIG. 5) connected to BL. The first circuit may include a pair of transistors 620-a, 620-b coupled by source and drain terminals between a voltage source HVDD (e.g., ½ of VDD) and BL (or /BL), and having gate terminals driven by a precharge (PC) signal. A third transistor 625 coupled by source and drain terminals between BL and its /BL, may also have a gate terminal driven by the PC signal.

The sense amplifier 600 may include a second circuit operable to bias BL to a second voltage prior to reading from a second memory cell array (e.g., a FeRAM array configured similarly to the memory cell array 505-b described with reference to FIG. 5). The second circuit may include a transistor 630-a coupled by source and drain terminals between BL and VSS (or ground). The gate terminal of the transistor 630-a may be driven by a selection signal, FER. The FER signal may also drive a transistor 635-a that biases /BL to a voltage Vref when BL is biased to VSS. Similarly, a pair of transistors 630-b, 635-b having gate terminals driven by the selection signal FEL may bias /BL to VSS and BL to Vref prior to reading from a memory cell array connected to /BL.

Figure 7:
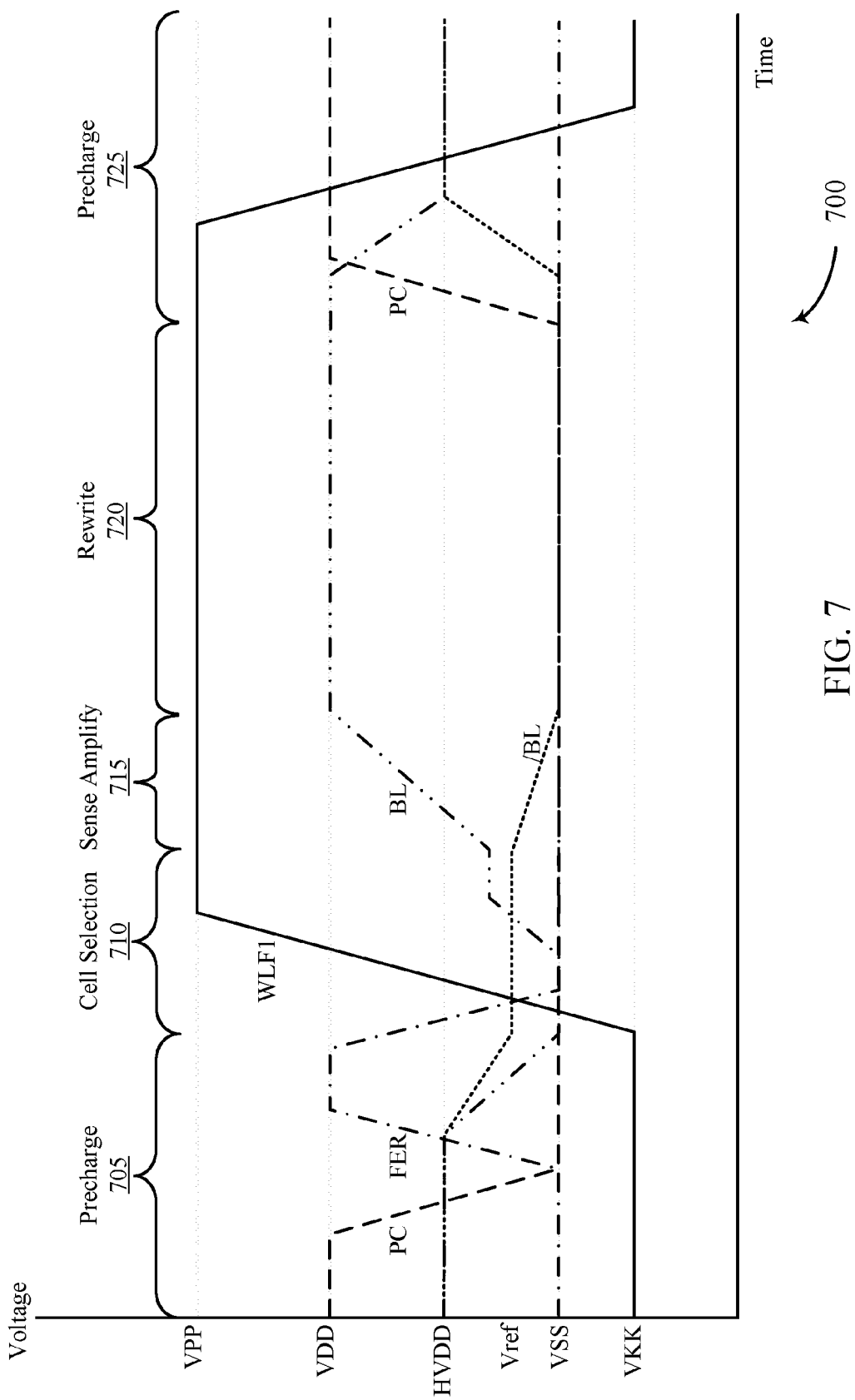
FIG. 7 illustrates example waveforms for use in read-out and rewriting operations at the second memory cell array described with reference to FIG. 5, when the second memory cell array is configured for FeRAM operation, and when the first sense amplifier is configured as described with reference to FIG. 6, in accordance with various embodiments.

FIG. 7 illustrates example waveforms 700 for use in read-out and rewriting operations at the second memory cell array 505-b described with reference to FIG. 5, when the second memory cell array 505-b is configured for FeRAM operation, and when the first sense amplifier 545-a is configured as described with reference to FIG. 6, in accordance with various embodiments.

When at the end of a precharge period 705, the PC signal may be switched from a high level (e.g., VDD) to a low level (e.g., VSS), and then the FER signal may be switched from the low level to the high level for a predetermined period of time. With the PC signal at the low level and the FER signal at the high level, BL may be switched from HVDD to VSS, while /BL may be switched from HVDD to Vref.

During a cell selection period 710 following the precharge period 705, an access line (e.g., WLF1) of the second memory cell array 505-b may be switched from a low level (e.g., VKK) to a high level (e.g., VPP), and a high-level signal voltage may be read out onto the second digit line (BLFk in FIG. 5 or BL in FIG. 6) from a memory cell 520 associated with the second digit line, BLFk, and the word line, WLF1.

During a sense amplify period 715 following the cell selection period 710, the CSN signal (shown in FIG. 6, but not FIG. 7) may be switched from a high level to a low level, and a CSP signal (also shown in FIG. 6, but not FIG. 7) may be switched from the low level to the high level, thereby activating the first sense amplifier 545-a so that signals on BL and /BL are sense-amplified. When this state is maintained through a rewrite period 720 following the sense amplify period 715, a high-level information rewrite is performed on the memory cell at the time of a high-level information read-out, and a low-level information rewrite is performed on the memory cell at the time of a low-level read-out.

During a beginning of a precharge period 725 following the rewrite period 720, the first sense amplifier 545-a may be deactivated, and the PC signal may be switched from the low level to the high level. This state causes BL and /BL to precharge to HVDD. The word line (WLF1) may then be switched from the high voltage to the low voltage, and a sequence of read-out and re-writing operations at the second memory cell array 505-b may be completed.

Figure 8:
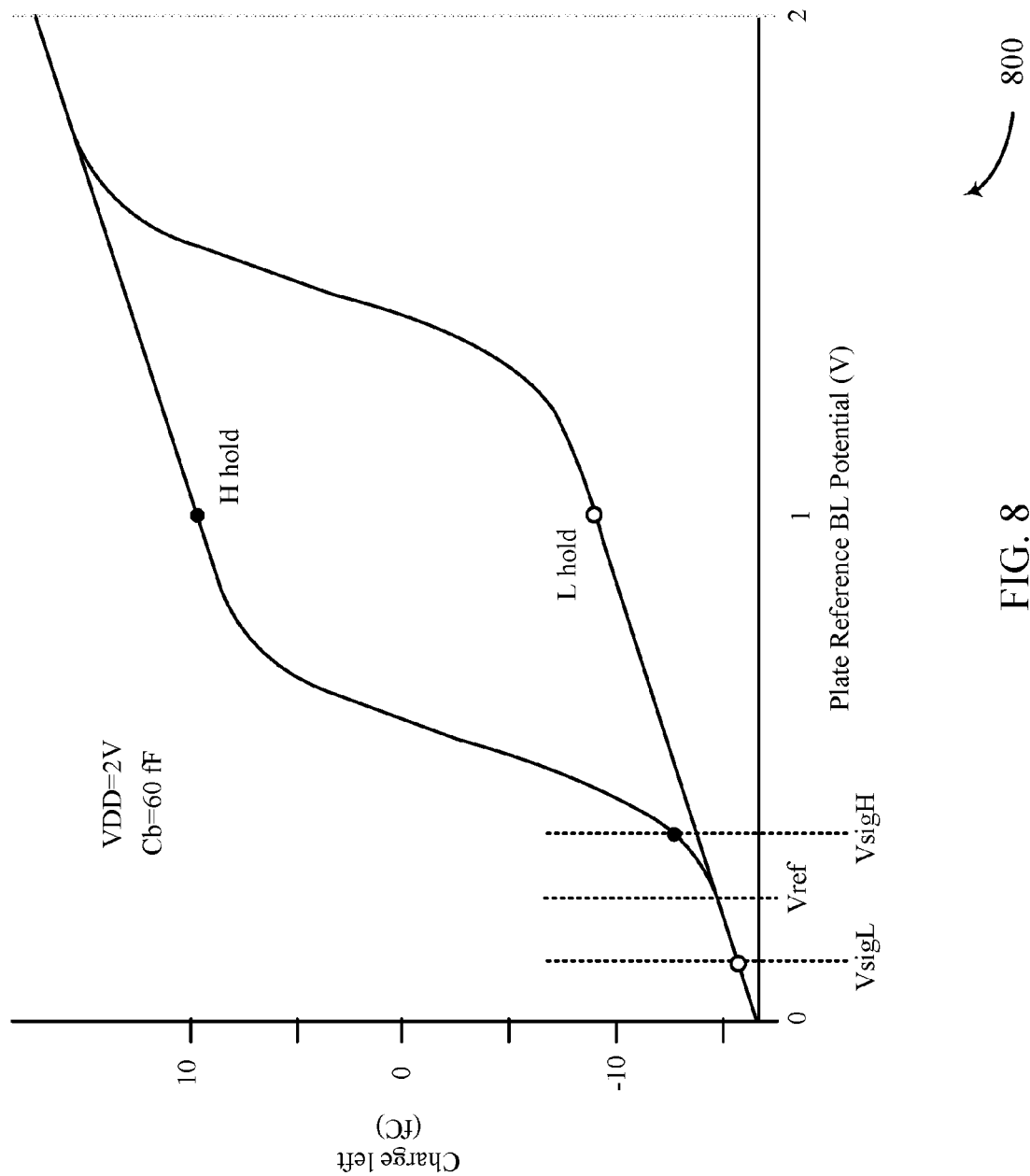
FIG. 8 illustrates hysteresis characteristics and examples of analyses of the read-out and re-writing operations at the second memory cell array described with reference to FIG. 5, when the second memory cell array is configured for FeRAM operation, in accordance with various embodiments.

FIG. 8 illustrates hysteresis characteristics and examples of analyses of the read-out and re-writing operations at the second memory cell array 505-b described with reference to FIG. 5, when the second memory cell array 505-b is configured for FeRAM operation, in accordance with various embodiments. In these examples, the amount of the residual polarization charge at the high-level information holding time (indicated by the black dot labeled "H hold") may be about 10 fC (femto-Coulomb), the amount of the residual polarization charge at the low-level information holding time (indicated by the white dot labeled "L hold") may be about 10 fC, and the digit line capacity may be 60 fF, so that when an access line of the second memory cell array 505-b is switched from the low level to the high level, the respective positions are moved in a left downward direction, and at an intersection with the load straight line (not shown in FIG. 8), the digit line voltage may become VsigH or VsigL. The difference between one of these voltages (VsigH or VsigL) and Vref forms a read-out signal voltage, and in accordance with this, the digit line voltage may be amplified to VDD=2V at the time of a high-level read-out operation, or amplified to VSS=0V at the time of a low-level read-out operation. When this state is maintained for a predetermined period of time, a re-writing operation may be completed; and when a precharge state is started, the sequence may return to the original information holding position ("H hold" or "L hold").

Figure 9:
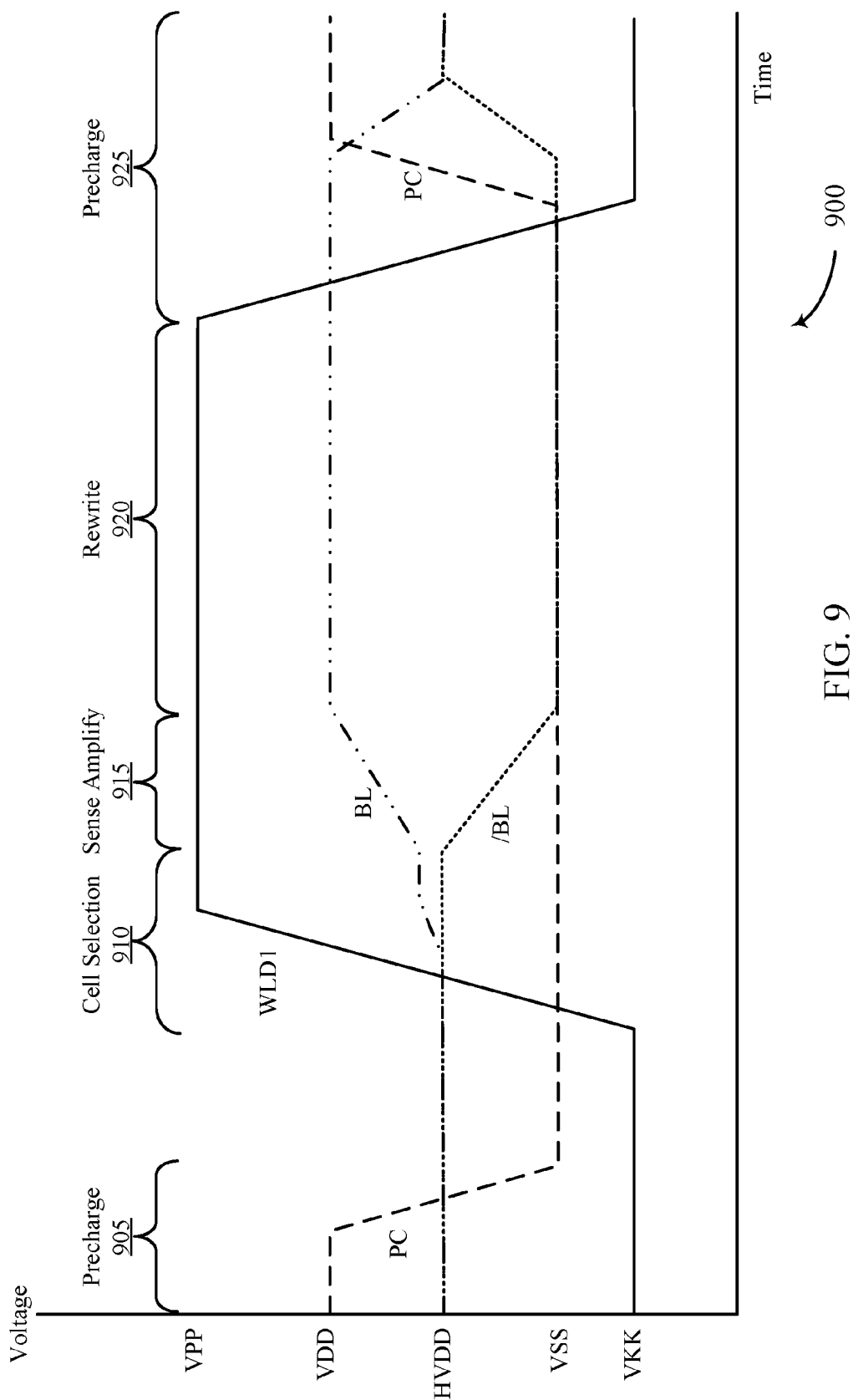
FIG. 9 illustrates example waveforms for use in read-out and rewriting operations at the first memory cell array (or the third memory cell array), when the first memory cell array is configured for DRAM operation, and when the first sense amplifier is configured as described with reference to FIG. 6, in accordance with various embodiments.

FIG. 9 illustrates example waveforms 900 for use in read-out and rewriting operations at the first memory cell array 505-a (or the third memory cell array 505-c), when the first memory cell array 505-a is configured for DRAM operation, and when the first sense amplifier 545-a is configured as described with reference to FIG. 6, in accordance with various embodiments.

When at the end of a precharge period 905, the PC signal may be switched from a high level (e.g., VDD) to a low level (e.g., VSS). During a cell selection period 910 following the precharge period 905, an access line (e.g., WLD1) of the first memory cell array 505-a may be switched from a low level (e.g., VKK) to a high level (e.g., VPP), and a high-level signal voltage may be read out onto the first digit line (BLDk in FIG. 5 or BL in FIG. 6) from a memory cell 510 associated with the first digit line, BLDk, and the word line, WLD1.

During a sense amplify period 915 following the cell selection period 910, the CSN signal (shown in FIG. 6, but not FIG. 9) may be switched from a high level to a low level, and a CSP signal (also shown in FIG. 6, but not FIG. 9) may be switched from the low level to the high level, thereby activating the first sense amplifier 545-a so that signals on BL and /BL are sense-amplified. When this state is maintained through a rewrite period 920 following the sense amplify period 915, a high-level information re-write is performed on the memory cell at the time of a high-level information read-out, and a low-level information rewrite is performed on the memory cell at the time of a low-level read-out.

During a beginning of a precharge period 925 following the rewrite period 920, the word line (WLD1) may be switched from the high voltage to the low voltage. Then, the first sense amplifier 545-a may be deactivated, and the PC signal may be switched from the low level to the high level.

This state causes BL and /BL to precharge to HVDD, and a sequence of read-out and re-writing operations at the first memory cell array 505-*a* may be completed.

Figure 10:
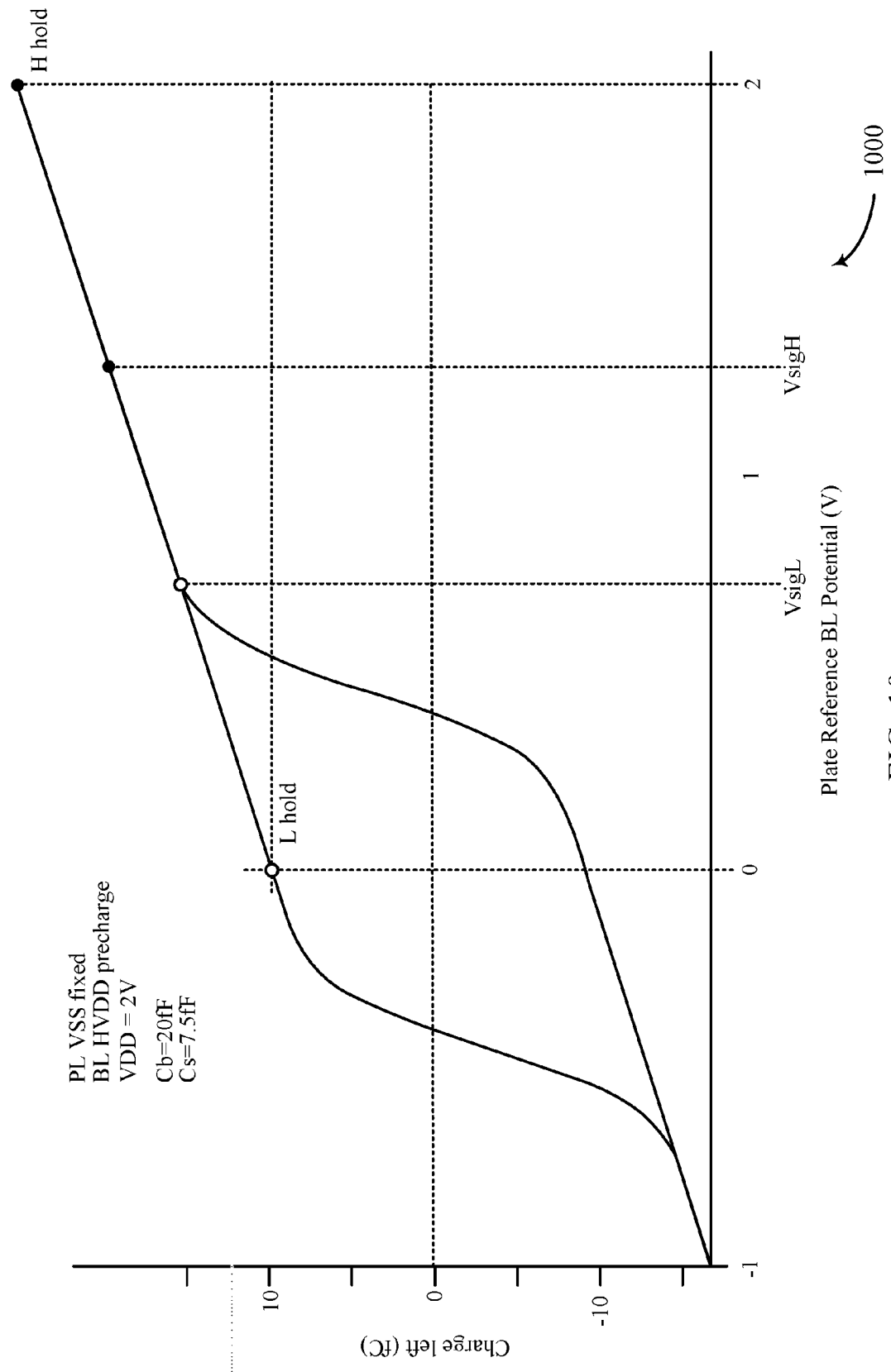
FIG. 10 illustrates hysteresis characteristics and examples of analyses of the read-out and re-writing operations at the first memory cell array described with reference to FIG. 5, when the first memory cell array is configured for DRAM operation, in accordance with various embodiments.

FIG. 10 illustrates hysteresis characteristics and examples of analyses of the read-out and re-writing operations at the first memory cell array 505-*a* described with reference to FIG. 5, when the first memory cell array 505-*a* is configured for DRAM operation, in accordance with various embodiments. When operating in a DRAM mode of operation, only the paraelectric component of the ferroelectric capacitor of a memory cell is used. Thus, read-out and rewriting operations are carried out within a linear region of the hysteresis characteristics. The capacity of the paraelectric component of the ferroelectric capacitor may be set to about 7.5 fF. In these examples, the position indicated by the black dot labeled "H hold" may correspond to a high-level information holding time, and the position indicated by the white dot labeled "L hold" may correspond to a low-level information holding time. Moreover, the digit line capacity may be set to 20 fF, and when the word line is switched from the low level to the high level, at an intersection with the load straight line (not shown in FIG. 10), the digit line voltage may become VsigH or VsigL due to a charge share with the digit line capacity. The difference between this voltage and HVDD=1V corresponding to the digit line precharge voltage may form a read-out signal voltage, and in accordance with this, the digit line voltage may be amplified to VDD=2V at the time of the high-level read-out operation, or amplified to VSS=0V at the time of a low-level read-out operation. When this state is maintained for a predetermined period of time, a re-writing operation may be completed; and when a precharge state is started, the sequence may return to the original information holding position ("H hold" or "L hold").

Figure 11:
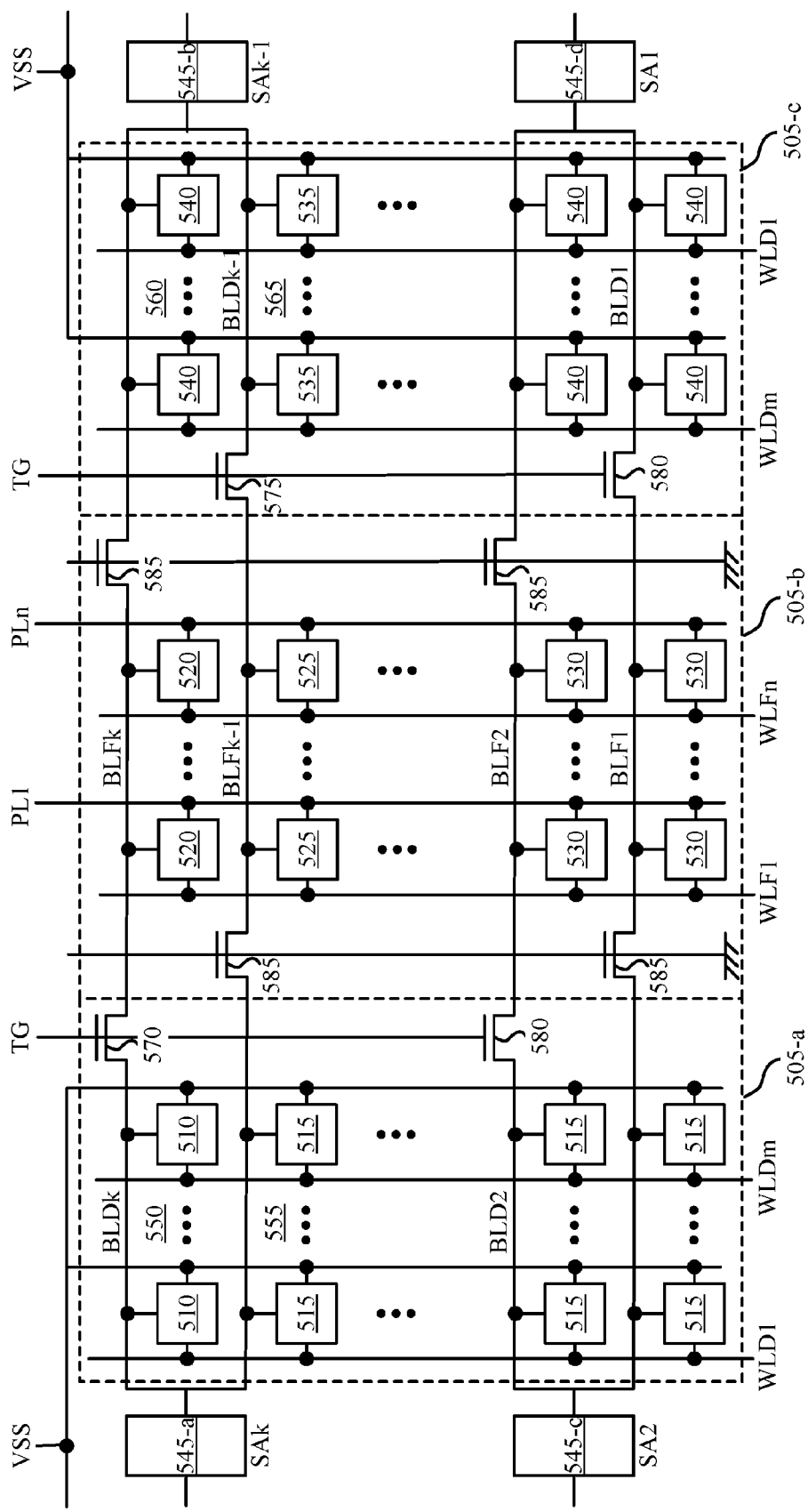
FIG. 11 illustrates a third example of an apparatus 1100 including a hybrid memory, in accordance with various embodiments

FIG. 11 illustrates a third example of an apparatus 1100 including a hybrid memory, in accordance with various embodiments. The apparatus 1100 may be configured similarly to the apparatus 500 described with reference to FIG. 5, and may include a first memory cell array 505-*a*, a second memory cell array 505-*b*, and a third memory cell array 505-*c*. The second memory cell array 505-*b* may be positioned between the first memory cell array 505-*a* and the third memory cell array 505-*c*. In some examples, the apparatus 1100 may be an example of aspects of one block of the memory device 100 described with reference to FIGS. 1 and 3.

The apparatus 500 described with reference to FIG. 5 may be used to perform FeRAM operations in the second memory cell array 505-*b* at a comparatively high power-supply voltage (e.g., VDD=2 V). In contrast, the apparatus 1100 may be used to perform FeRAM operations in the second memory cell array 505-*b* at a comparatively low power-supply voltage (e.g., VDD=1V). The apparatus 1100 may differ from the apparatus 500 in that each cell plate in the second plurality of memory cells (e.g., each cell plate of a memory cell connected to the second digit line (BLFk)) may be connected to a different voltage potential line (e.g., to a different one of plate lines PL1, PLn, etc.) of a plurality of voltage potential lines. Similarly, each cell plate in the third plurality of memory cells (e.g., each cell plate of a memory cell connected to the third digit line (BLFk−1)) may be connected to a different voltage potential line. Memory cells in a same column and connected to a same word line may be connected to the same voltage potential line. Each of the plurality of voltage potential lines may be independently controllable.

Figure 12:
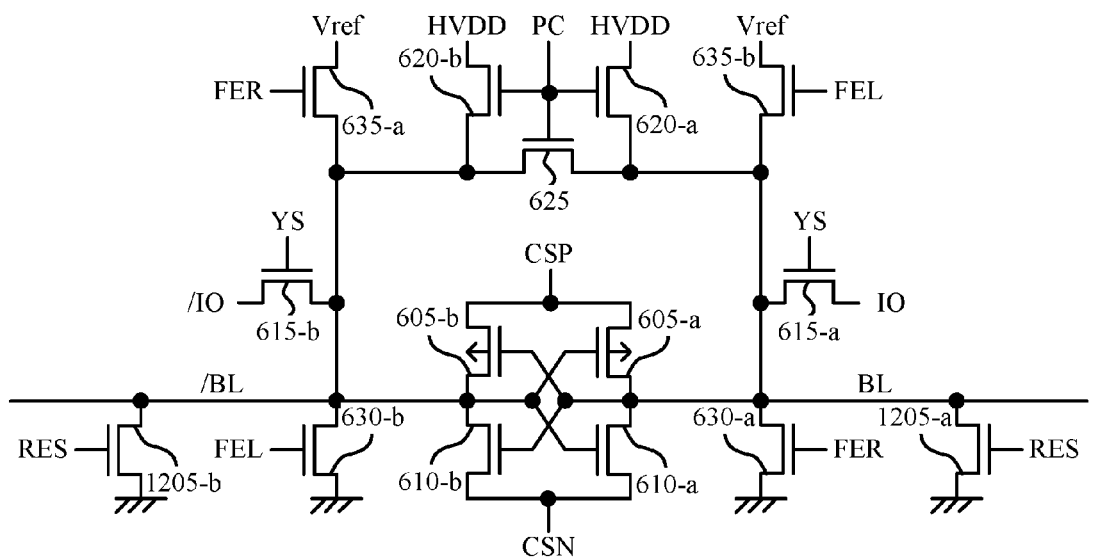
FIG. 12 illustrates a second example of a sense amplifier, in accordance with various embodiments.

FIG. 12 illustrates a second example of a sense amplifier 1200, in accordance with various embodiments. The sense amplifier may be configured similarly to the sense amplifier 600 described with reference to FIG. 6. In some examples, the sense amplifier 1200 may be an example of aspects of one of the sense amplifiers 545 show in FIG. 11.

The sense amplifier 1200 differs from the sense amplifier 600 described with reference to FIG. 6 in that a first pull-down transistor 1205-*a* (e.g., a first nMOS transistor) is added to pull the digit line, BL, to VSS (ground), and a second pull-down transistor 1205-*b* (e.g., a second nMOS transistor) is added to pull the complimentary digit line, /BL, to VSS. The gate terminals of the first and second pull-down transistors 1205-*a*, 1205-*b* may be driven by a reset (RES) signal, to enable resetting of the digit line and complimentary digit line, to VSS, in parallel.

Figure 13:
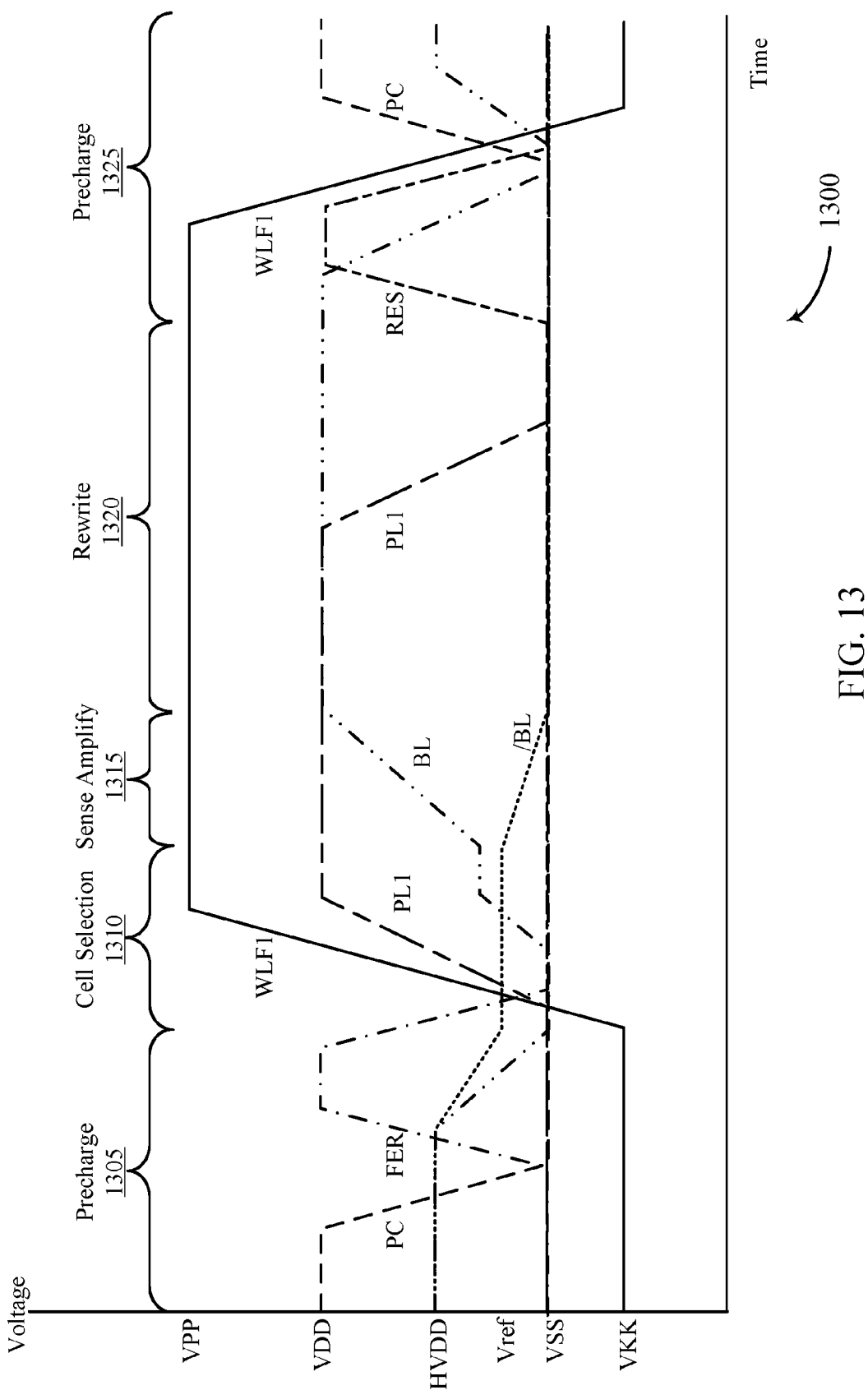
FIG. 13 illustrates example waveforms for use in read-out and rewriting operations at the second memory cell array described with reference to FIG. 11, when the second memory cell array is configured for FeRAM operation, and when the first sense amplifier is configured as described with reference to FIG. 12, in accordance with various embodiments.

FIG. 13 illustrates example waveforms 1300 for use in read-out and rewriting operations at the second memory cell array 505-*b* described with reference to FIG. 11, when the second memory cell array 505-*b* is configured for FeRAM operation, and when the first sense amplifier 545-*a* is configured as described with reference to FIG. 12, in accordance with various embodiments.

When at the end of a precharge period 1305, the PC signal may be switched from a high level (e.g., VDD) to a low level (e.g., VSS), and then the FER signal may be switched from the low level to the high level for a predetermined period of time. With the PC signal at the low level, BL may be switched from HVDD to VSS, while /BL may be switched from HVDD to Vref.

During a cell selection period 1310 following the precharge period 1305, an access line (e.g., WLF1) of the second memory cell array 505-*b* may be switched from a low level (e.g., VKK) to a high level (e.g., VPP), the voltage potential line PL1 may be switched from a low level to a high level, and a high-level signal voltage may be read out onto the second digit line (BLFk in FIG. 11 or BL in FIG. 12) from a memory cell 520 associated with the second digit line BLFk, and the word line, WLF1.

During a sense amplify period 1315 following the cell selection period 1310, the CSN signal (shown in FIG. 12, but not FIG. 13) may be switched from a high level to a low level, and a CSP signal (also shown in FIG. 12, but not FIG. 13) may be switched from the low level to the high level, thereby activating the first sense amplifier 545-*a* so that signals on BL and /BL are sense-amplified. When this state is maintained through a rewrite period 1320 following the sense amplify period 1315, a low-level information rewrite is performed on the memory cell at the time of a low-level information read-out. When the voltage potential line PL1 is switched from the high level to the low level, a high-level information rewrite is performed on the memory cell at the time of a high-level read-out.

During a beginning of a precharge period 1325 following the rewrite period 1320, the first sense amplifier 545-*a* may be deactivated, and then the RES signal may be switched from a low level (e.g., VSS) to a high level (e.g., VDD) for a predetermined period of time, so that BL and /BL may be reset to VSS. Successively, the WLF1 is controlled to VKK, and lastly, the PC is controlled to the high level so that the BL and /BL are precharged to HVDD, thereby completing a sequence of read-out and re-writing operations.

Figure 14:
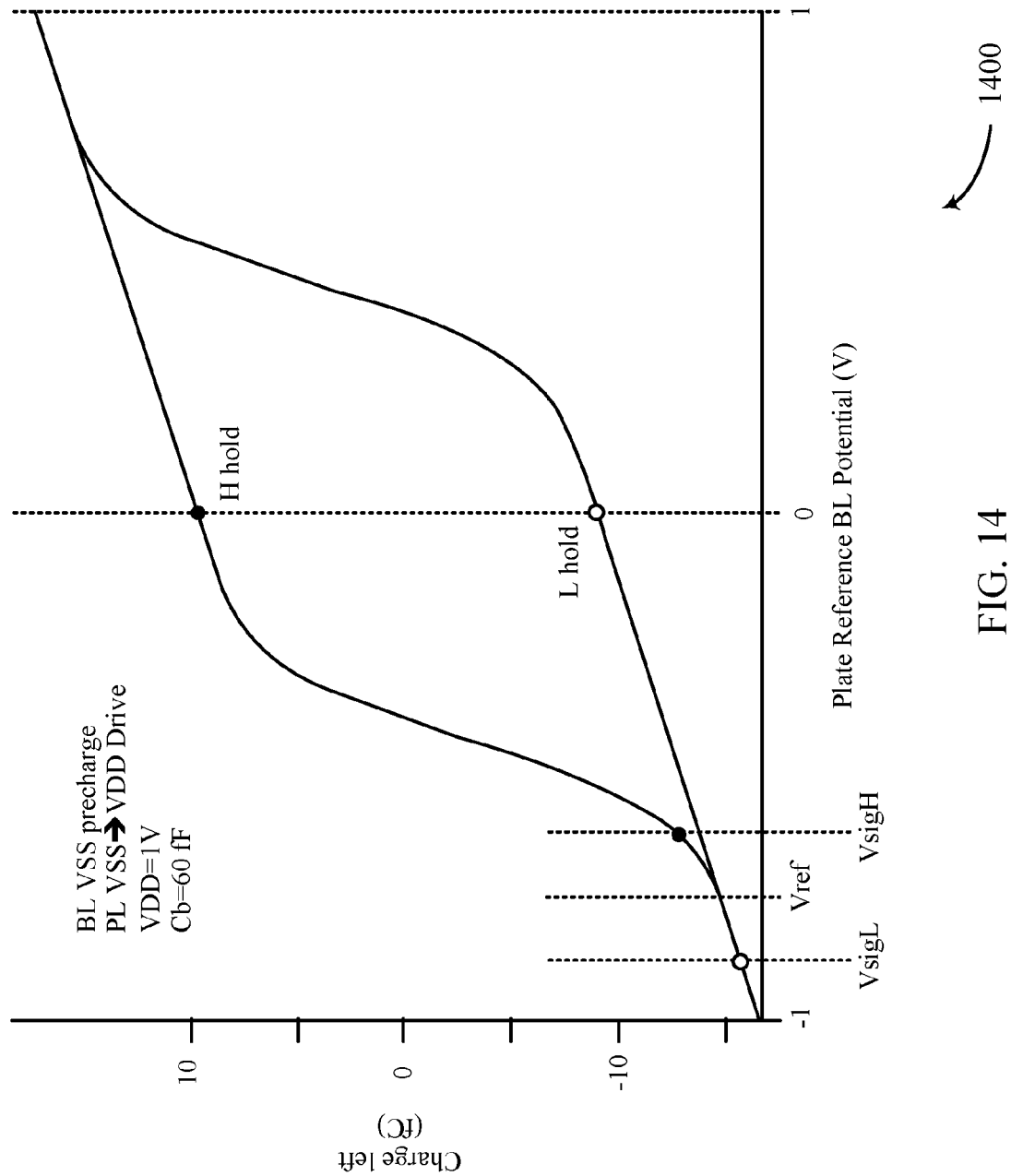
FIG. 14 shows hysteresis characteristics and examples of analyses of the read-out and re-writing operations at the second memory cell array described with reference to FIG. 11, when the second memory cell array is configured for FeRAM operation, in accordance with various embodiments.

FIG. 14 shows hysteresis characteristics and examples of analyses of the read-out and re-writing operations at the second memory cell array 505-*b* described with reference to FIG. 11, when the second memory cell array 505-*b* is configured for FeRAM operation, in accordance with various embodiments. In these examples, the amount of the residual polarization charge at the high-level information holding time (indicated by the black dot labeled "H hold") may be about 10 fC, the amount of residual polarization charge at the low-level information holding time (indicated by the white dot labeled "L hold") may be about 10 fC, and the digit line capacity may be about 60 fF, so that when a voltage potential line (plate line) of the second memory cell array 505-b is switched from the low level to the high level, the respective positions are moved in a left downward direction, and at an intersection with the load straight line (not shown in FIG. 14), the digit line voltage becomes VsigH or VsigL. The difference between one of these voltages (VsigH or VsigL) and Vref forms a read-out signal voltage, and in accordance with this, the digit line voltage may be amplified to VDD=1V at the time of the high-level read-out operation, or amplified to VSS=0V at the time of a low-level read-out operation. At the time of the low-level read-out operation, this state forms a re-writing state; however, at the time of the high-level read-out operation, since both the cell plate voltage and the digit line voltage become 1V, the black dot is located in the vicinity of the L-holding position. When the cell plate voltage is driven to VSS so as to rewrite high-level information, the black dot may be returned to a right upward side on the hysteresis curve, and the white dot may be returned to the L-hold state. When BL is successively reset to VSS, the black dot is returned to the H-hold state, thereby completing the re-writing process. When the precharge state is then started, the electric potential of BL is pre-charged to HVDD=0.5V.

Figure 15:
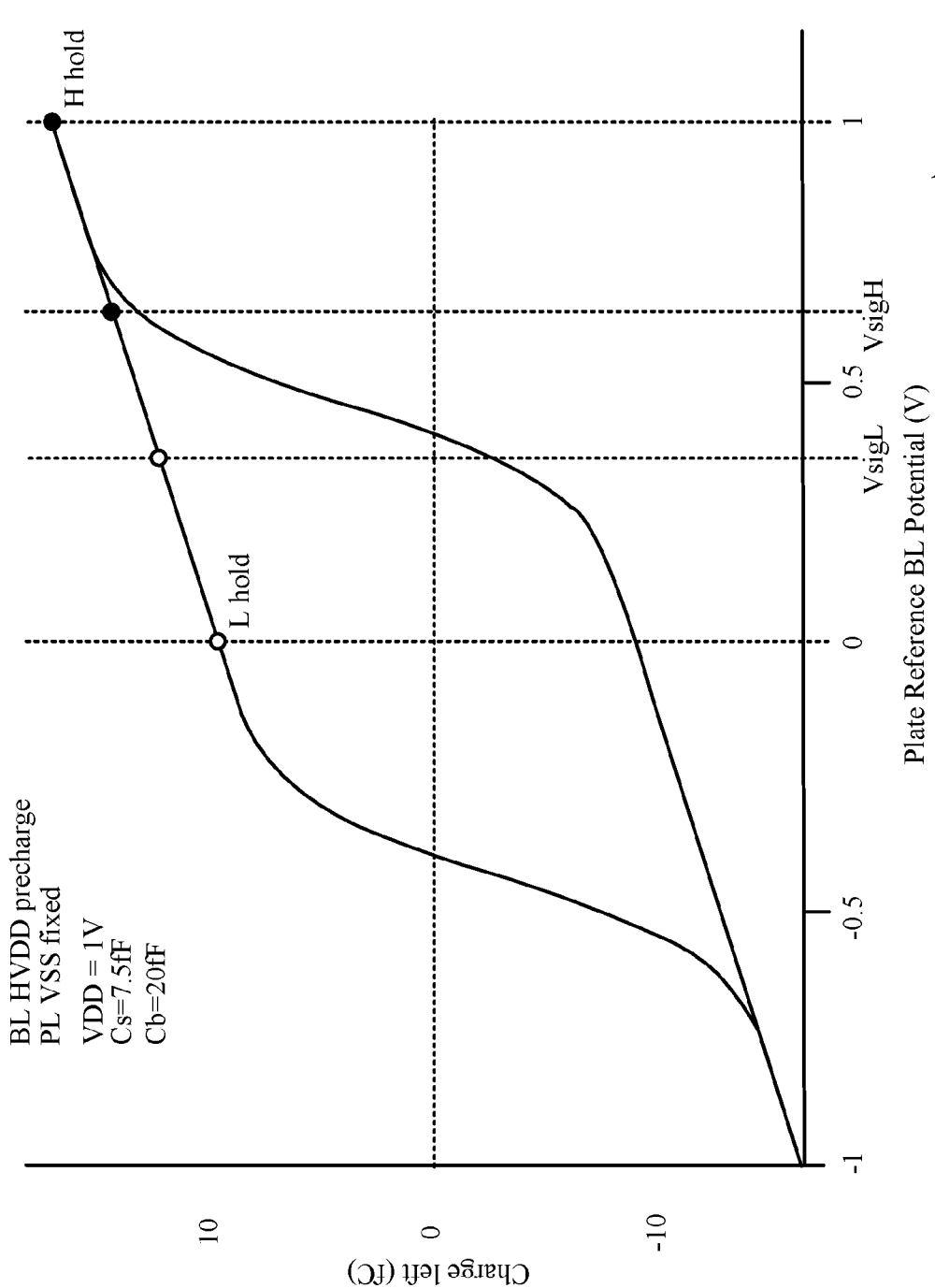
FIG. 15 illustrates hysteresis characteristics and examples of analyses of the read-out and re-writing operations at the first memory cell array described with reference to FIG. 5, when the first memory cell array is configured for DRAM operation, in accordance with various embodiments.

FIG. 15 illustrates hysteresis characteristics and examples of analyses of the read-out and re-writing operations at the first memory cell array 505-a described with reference to FIG. 11, when the first memory cell array 505-a is configured for DRAM operation, in accordance with various embodiments. When operating in a DRAM mode of operation, only the paraelectric component of the ferroelectric capacitor of a memory cell is used. Thus, read-out and rewriting operations are carried out within a linear region of the hysteresis characteristics. The capacity of the paraelectric component of the ferroelectric capacitor may be set to about 7.5 fF. In these examples, the position indicated by the black dot labeled "H hold" may correspond to a high-level information holding time, and the position indicated by the white dot labeled "L hold" may correspond to a low-level information holding time. Moreover, the digit line capacity may be set to 20 fF, and when the word line is switched from the low level to the high level, at an intersection with the load straight line (not shown in FIG. 15), the digit line voltage may become VsigH or VsigL, due to a charge share with the digit line capacity. The difference between this voltage and HVDD=0.5V corresponding to the digit line precharge voltage may form a read-out signal voltage, and in accordance with this, the digit line voltage may be amplified to VDD=1V at the time of the high-level read-out operation, or amplified to VSS=0V at the time of a low-level read-out operation. When this state is maintained for a predetermined period of time, a re-writing operation may be completed; and when a precharge state is started, the sequence may return to the original information holding position ("H hold" or "L hold").

Figure 16:
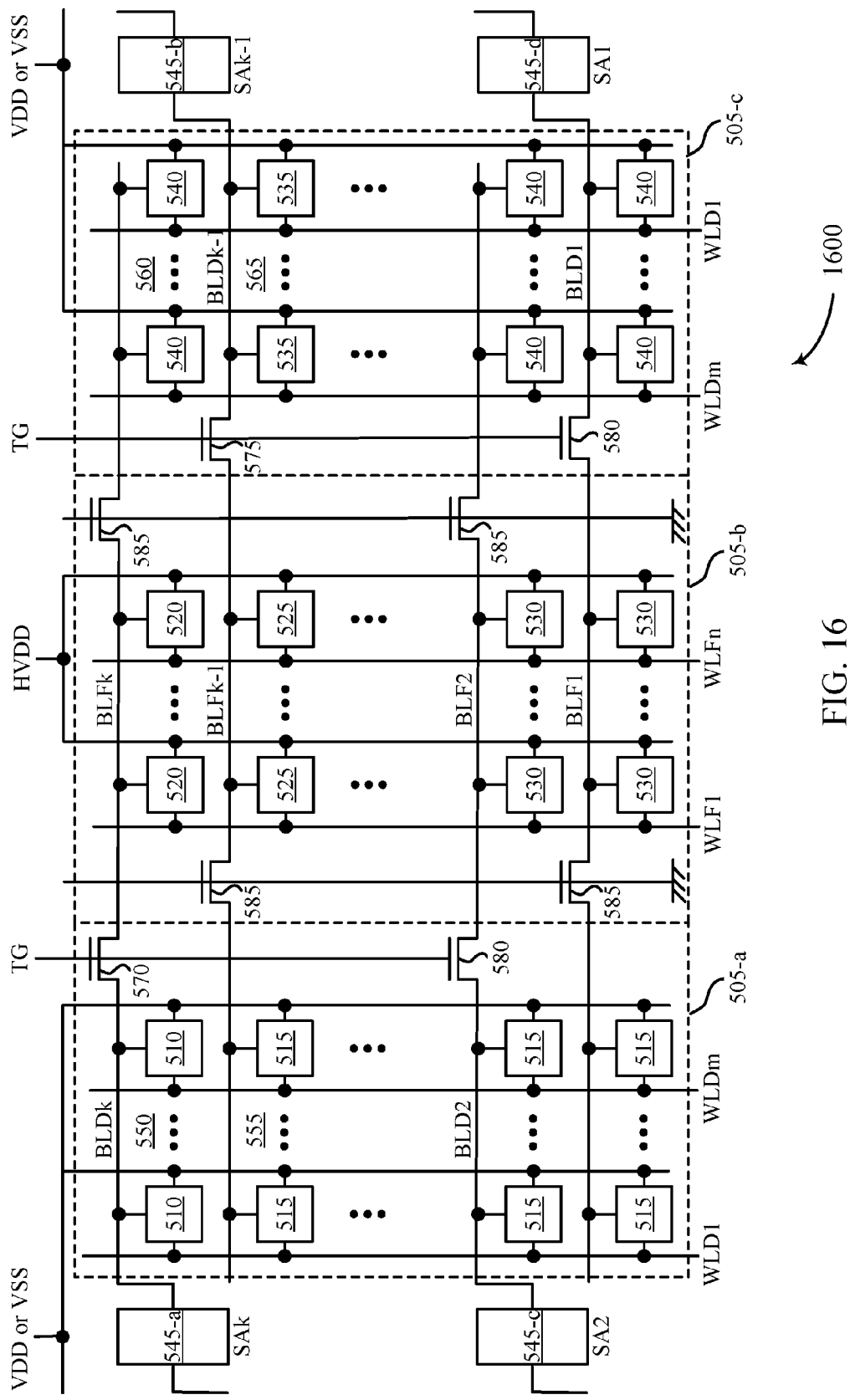
FIG. 16 illustrates a fourth example of an apparatus including a hybrid memory, in accordance with various embodiments.

FIG. 16 illustrates a fourth example of an apparatus 1600 including a hybrid memory, in accordance with various embodiments. The apparatus 1600 may be configured similarly to the apparatus 500 described with reference to FIG. 5, and may include a first memory cell array 505-a, a second memory cell array 505-b, and a third memory cell array 505-c. The second memory cell array 505-b may be positioned between the first memory cell array 505-a and the third memory cell array 505-c. In some examples, the apparatus 1600 may be an example of aspects of one block of the memory device 100 described with reference to FIGS. 1 and 3.

In contrast to the apparatus 500 described with reference to FIG. 5, the digit lines (e.g., BLD1, BLD2, BLDk−1, BLDk, etc.) of the first and third memory cell arrays 505-a, 505-c in the apparatus 1600 are not folded back. For example, the second subset of memory cells 555 connected to the first digit line (BLDk), and the portion of the first digit line to which the second subset of memory cells 555 is connected, may be decoupled from the first sense amplifier 545-a. Alternatively, the apparatus 1600 may be constructed without the second subset of memory cells 555 and the portion of the first digit line to which the second subset of memory cells 555 is connected. This reduces the parasitic capacitance of the first digit line by about half and enables a greater number of memory cells to be connected to the second digit line (BLFk) of the second memory cell array 505-b. A similar modification may be made to each of the digit lines of the first and third memory cell arrays 505-a, 505-c, and a greater number of memory cells may be connected each of the digit lines of the second memory cell array 505-b. When the second memory cell array 505-b is configured as a FeRAM, the techniques described with reference to FIG. 16 may support a larger FeRAM than may be supported by the apparatus 500 described with reference to FIG. 5.

Figure 17:
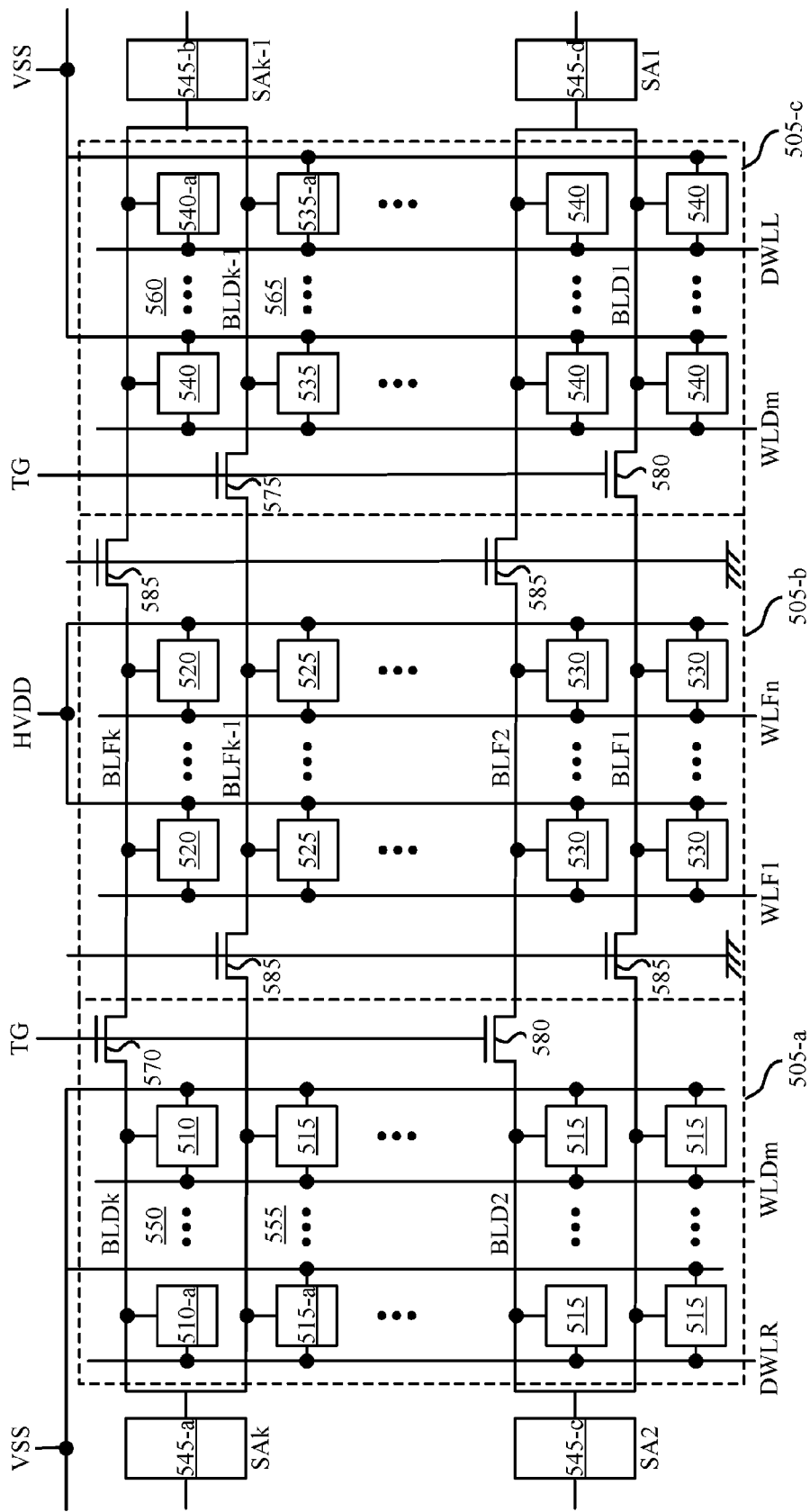
FIG. 17 illustrates a fifth example of an apparatus including a hybrid memory, in accordance with various embodiments.

FIG. 17 illustrates a fifth example of an apparatus 1700 including a hybrid memory, in accordance with various embodiments. The apparatus 1700 may be configured similarly to the apparatus 500 described with reference to FIG. 5, and may include a first memory cell array 505-a, a second memory cell array 505-b, and a third memory cell array 505-c. The second memory cell array 505-b may be positioned between the first memory cell array 505-a and the third memory cell array 505-c. In some examples, the apparatus 1700 may be an example of aspects of one block of the memory device 100 described with reference to FIGS. 1 and 3.

In contrast to the apparatus 500 described with reference to FIG. 5, the first and third memory cell arrays 505-a, 505-c may be provided with dummy word lines. For example, the first memory cell array 505-a may be provided with a first dummy word line, DWLR, and the third memory cell array 505-c may be provided with a second dummy word line, DWLL. Only one of the memory cells of the pair of DRAM memory cells coupled to each dummy word line (DWLR or DWLL) may be designed to effectively function (e.g., the cell plates of the memory cells 510-a and 540-a may not be coupled to VSS), and each of the remaining memory cells coupled to a dummy word line (e.g., the memory cells 515-a and 535-a) may function as a dummy (or reference) memory cell that provides a reference signal voltage level on a respective digit line. The reference signal voltage level may be used by a corresponding sense amplifier during a sensing (or read) operation. As a result, the digit lines of the first and third memory cell arrays 505-a, 505-c may be precharged to VSS during both DRAM operation and FeRAM operation of the apparatus 1700, and the sense amplifiers (e.g., the first sense amplifier 545-a, the second sense amplifier 545-b, the third sense amplifier 545-c, and the fourth sense amplifier 545-d) need not include a HVDD precharge control (e.g., the transistors 620-a, 620-b, and 625 described with reference to FIG. 6).

In some examples, the dummy word lines and non-functioning memory cells described with reference to FIG. 17 may be incorporated into the apparatus 1700 described with reference to FIG. 11, and the sense amplifiers of the apparatus 1100 need not include a HVDD precharge control.

Figure 18:
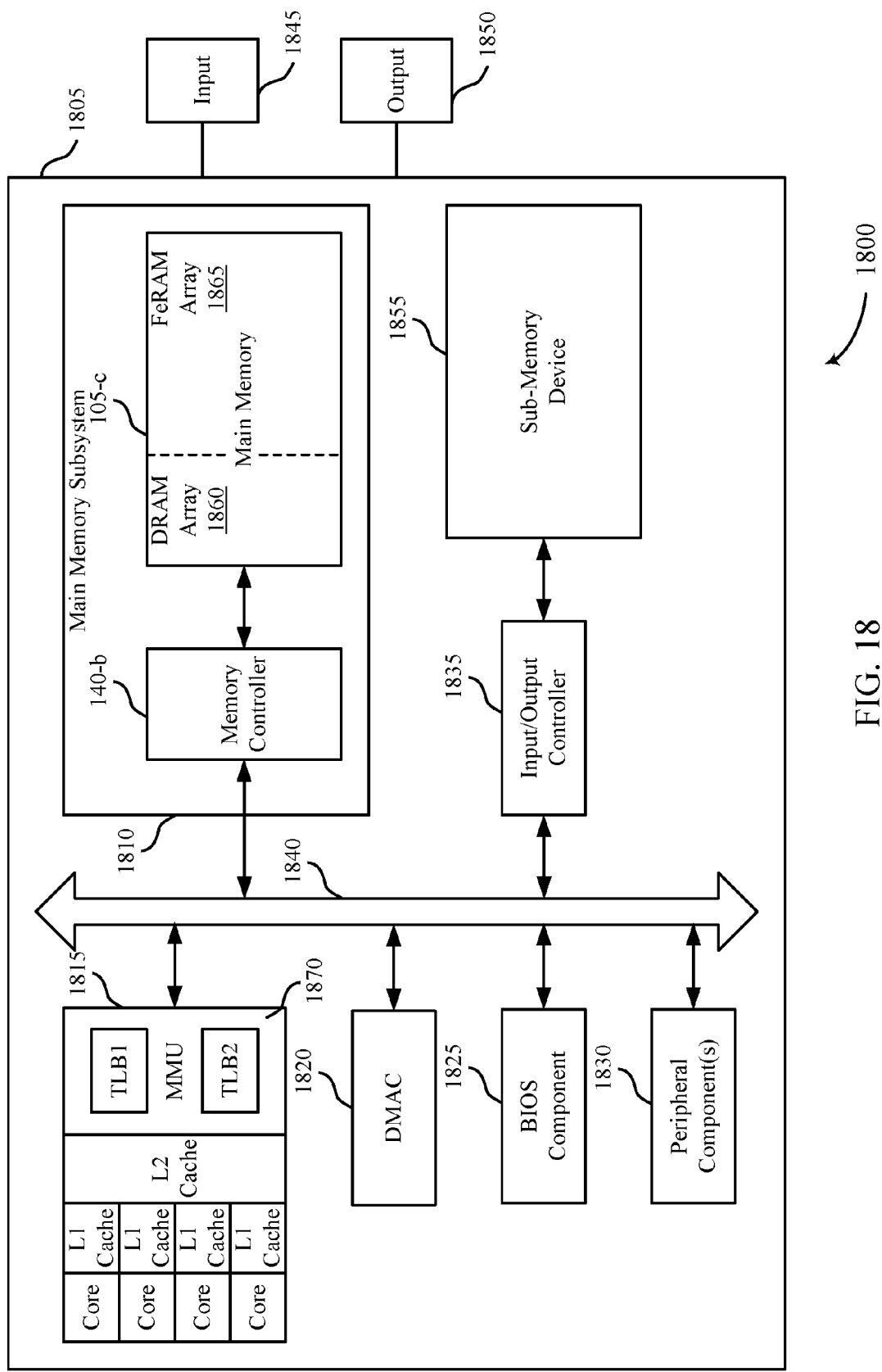
FIG. 18 shows a diagram of a system including a hybrid main memory, in accordance with various embodiments.

FIG. 18 shows a diagram of a system 1800 including a hybrid main memory, in accordance with various embodiments. The system 1800 may include a device 1805, which may be or include a printed circuit board to connect or physically support various components.

The device 1805 may include a main memory subsystem 1810, which may be an example of the memory devices 100 described in FIGS. 1 and 3. The main memory subsystem 1810 may contain a memory controller 140-b and a plurality of memory cells 105-c, which may be examples of the memory controllers 140 described with reference to FIGS. 1 and 3 and the memory cells 105, 410, 415, 420, 425, 510, 515, 520, 525, 530, 535, or 540 described with reference to FIGS. 1-5, 11, 16, and 17. In some examples, the main memory subsystem 1810 may include memory cells 105-c and a paging buffer register (including sense amplifiers) that are configured as described with reference to FIG. 4, 5, 11, 16, or 17.

The device 1805 may also include a processor 1815, a direct memory access controller (DMAC) 1820, a BIOS component 1825, peripheral component(s) 1830, and an input/output controller 1835. The components of the device 1805 may be in electronic communication with one another through a bus 1840. The processor 1815 may be configured to operate the main memory subsystem 1810 through the memory controller 140-b. In some cases, the memory controller 140-b may perform the functions of the memory controller 140 described with reference to FIG. 1 or 3. In other cases, the memory controller 140-b may be integrated into the processor 1815. The processor 1815 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these types of components. In some examples, the processor 1815 may be a multicore processor. The processor 1815 may perform various functions described herein. The processor 1815 may, for example, be configured to execute computer-readable instructions stored in the memory cells 105-c to cause the device 1805 to perform various functions or tasks.

The DMAC 1820 may enable the processor 1815 to perform direct memory accesses within the main memory subsystem 1810.

The BIOS component 1825 may be a software component that includes a basic input/output system (BIOS) operated as firmware, which may initialize and run various hardware components of the system 1800. The BIOS component 1825 may also manage data flow between the processor 1815 and various other components, e.g., the peripheral component(s) 1830, the input/output controller 1835, etc. The BIOS component 1825 may include a program or software stored in read-only memory (ROM), flash memory, or any other non-volatile memory.

The peripheral component(s) 1830 may be any input or output device, or an interface for such devices, that is integrated into the device 1805. Examples of peripheral devices may include disk controllers, sound controllers, graphics controllers, Ethernet controllers, modems, USB controllers, serial or parallel ports, or peripheral card slots, such as peripheral component interconnect (PCI) or accelerated graphics port (AGP) slots.

The input/output controller 1835 may manage data communication between the processor 1815 and the peripheral component(s) 1830, the input device(s) 1845, the output device(s) 1850, and/or the sub-memory device 1855. The input/output controller 1835 may also manage peripherals not integrated into the device 1805. In some cases, the input/output controller 1835 may represent a physical connection or port to an external peripheral.

The input device(s) 1845 may represent a device or signal external to the device 1805 that provides input to the device 1805 or its components. This may include a user interface or interface with or between other devices. In some cases, the input device(s) 1845 may include a peripheral that interfaces with the device 1805 via the peripheral component(s) 1830, or that can be managed by the input/output controller 1835.

The output device(s) 1850 may represent a device or signal external to the device 1805 that is configured to receive output from the device 1805 or any of its components. Examples of the output device(s) 1850 may include a display, audio speakers, a printing device, another processor or printed circuit board, etc. In some cases, output device(s) 1850 may include a peripheral that interfaces with the device 1805 via one of the peripheral component(s) 1830, or that can be managed by the input/output controller 1835.

The components of the device 1805, including the memory controller 140-b and the memory cells 105-c, may include circuitry designed to carry out their functions. This may include various circuit elements, for example, conductive lines, transistors, capacitors, inductors, resistors, amplifiers, or other active or inactive elements, configured to carry out the functions described herein.

In some examples of the device 1805, the memory cells 105-c of the main memory subsystem 1810 may be allocated between a DRAM array 1860 and a FeRAM array 1865, with memory cells and digit lines of the FeRAM array 1865 being selectively coupled to sense amplifiers of the main memory subsystem 1810 through digit lines of the DRAM array 1860 (e.g., by transfer gates operated by the memory controller 140-b). In some examples, the processor 1815 may issue at least one of a read command to cause the memory controller 140-b to close the transfer gates coupling the digit lines of the FeRAM array 1865 to the digit lines of the DRAM array 1860 and transfer data from the FeRAM array 1865 to the DRAM array 1860, or a write command to cause the memory controller 140-b to close the transfer gates and transfer data from the DRAM array 1860 to the FeRAM array 1865. The processor 1815 may also issue commands to cause the memory controller 140-b to transfer between the main memory subsystem 1810 and the processor 1815.

In some of these examples, the DRAM array 1860 may be operated by the memory controller 140-b as a cache memory for the FeRAM array 1865. For example, a memory managing unit (MMU) 1860 of the processor 1815 may manage a page address of the main memory subsystem 1810 using two translation-lookaside buffers (e.g., TLB1 and TLB2). The MMU 1870 may manage a memory system including three hierarchies, e.g., the DRAM array 1860, the FeRAM array 1865, and the sub-memory device 1855. In some examples, the memory controller 140-b may issue a save command in a direction reversed to the transferring direction of the page data from the FeRAM array 1865 to the DRAM array 1860. Because the DRAM array 1860 and the FeRAM array 1865 share digit lines and sense amplifiers, data may be easily transferred and saved between the DRAM array 1860 and the FeRAM array 1865.

In some examples of the device 1805, the memory controller 140-b may control the memory cells 105-c by disposing page data having different attributes in accordance with respective characteristics of the DRAM array 1860, the FeRAM array 1865, or the sub-memory device 1855. For example, the processor 1815 may cause the memory controller 140-*b* to operate the transfer gates coupling the digit lines of the FeRAM array 1865 to the digit lines of the DRAM array 1860, to write a first type of data to the DRAM array 1860 and write a second type of data to the FeRAM array 1865.

Figure 19:
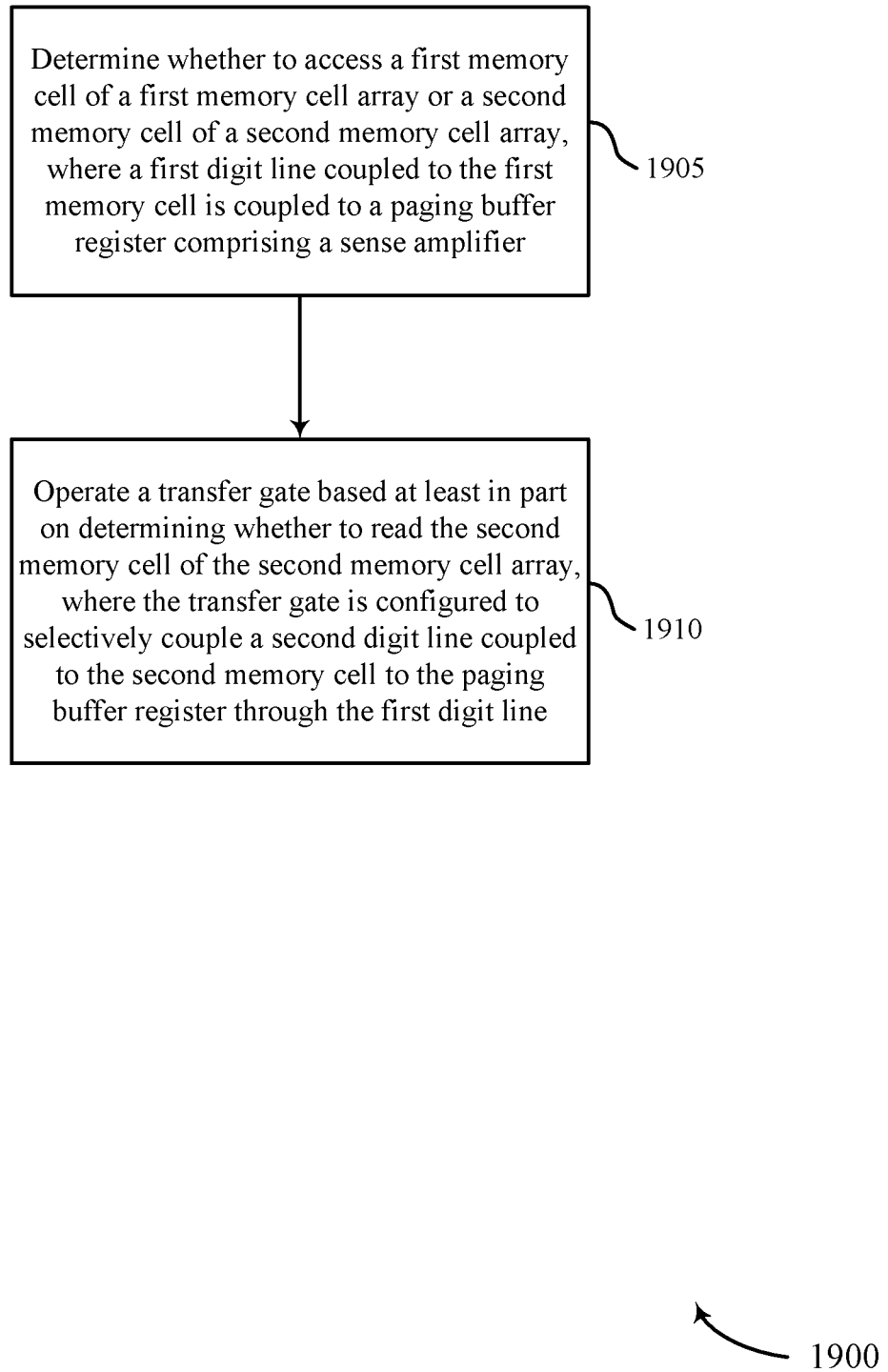
FIG. 19 shows a flowchart illustrating a method 1900 of operating a memory device, in accordance with various embodiments.

FIG. 19 shows a flowchart illustrating a method 1900 of operating a memory device, in accordance with various embodiments. The operations of the method 1900 may be performed on or within a memory array, such as the memory cell arrays 405 and 505 described with reference to FIGS. 4, 5, 11, 16, and 17. In some examples, the operations of the method 1900 may be performed by or under the control of a memory controller, such as the memory controller 140 described with reference to FIGS. 1, 3, and 18. In some examples, a memory controller may execute a set of codes to control the functional elements of a memory array to perform the functions described below. Additionally or alternatively, the memory controller may perform aspects of the functions described below using special-purpose hardware.

At block 1905, the method may include determining whether to access a first memory cell of a first memory cell array or a second memory cell of a second memory cell array. A first digit line coupled to the first memory cell may be coupled to a paging buffer register including a sense amplifier, as described with reference to FIGS. 4, 5, 11, 16, and 17. In some examples, the first memory cell may include a first ferroelectric memory cell, and the second memory cell may include a second ferroelectric memory cell. In some examples, the first ferroelectric memory cell may be configured to operate in a volatile mode (e.g., a DRAM mode), and the second ferroelectric memory cell may be configured to operate in a non-volatile mode (e.g., a FeRAM mode). In some examples, the operation(s) at block 1905 may be performed using the memory controller 140 described with reference to FIGS. 1, 3, and 18.

At block 1910, the method may include operating a transfer gate based at least in part on determining to read the second memory cell of the second memory cell array. The transfer gate may be configured to selectively couple a second digit line coupled to the second memory cell to the paging buffer register through the first digit line, as described with reference to FIGS. 4, 5, 11, 16, and 17. In some examples, the operation(s) at block 1910 may be performed using the memory controller 140 described with reference to FIGS. 1, 3, and 18.

In some examples of the method 1900, the first digit line may be coupled to a first plurality of memory cells including the first memory cell, and the second digit line may be coupled to a second plurality of memory cells including the second memory cell. In some of these examples, the first plurality of memory cells may include fewer memory cells than the second plurality of memory cells.

In some examples of the method 1900, the method may include preventing inversion of a ferroelectric film of a capacitor of the first memory cell by biasing a cell plate of the first memory cell. In some examples, the method may include biasing each cell plate of each memory cell in the second memory cell array to a common voltage. In some examples, the method may include independently biasing a voltage of each cell plate of each memory cell in the second memory cell array.

In some examples of the method 1900, the method may include operating the first memory cell array as an embedded cache for the second memory cell array.

Figure 20:
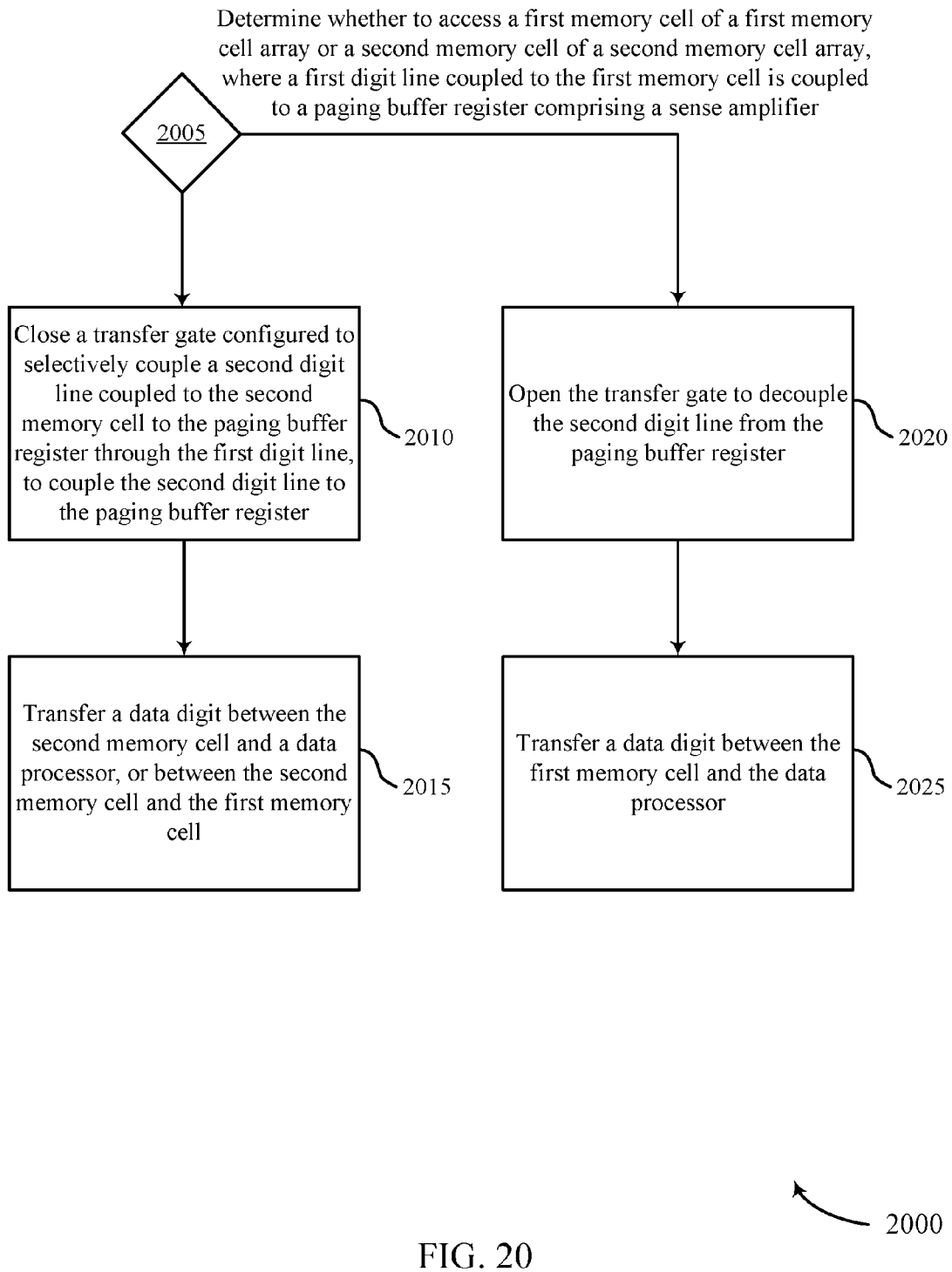
FIG. 20 shows a flowchart illustrating a method 2000 of operating a memory device, in accordance with various embodiments.

FIG. 20 shows a flowchart illustrating a method 2000 of operating a memory device, in accordance with various embodiments. The operations of the method 2000 may be performed on or within a memory array, such as the memory cell arrays 405 and 505 described with reference to FIGS. 4, 5, 11, 16, and 17. In some examples, the operations of the method 2000 may be performed by or under the control of a memory controller, such as the memory controller 140 described with reference to FIGS. 1, 3, and 18. In some examples, a memory controller may execute a set of codes to control the functional elements of a memory array to perform the functions described below. Additionally or alternatively, the memory controller may perform aspects of the functions described below using special-purpose hardware.

At block 2005, the method may include determining whether to access a first memory cell of a first memory cell array or a second memory cell of a second memory cell array. A first digit line coupled to the first memory cell may be coupled to a paging buffer register including a sense amplifier, as described with reference to FIGS. 4, 5, 11, 16, and 17. In some examples, the first memory cell may include a first ferroelectric memory cell, and the second memory cell may include a second ferroelectric memory cell. In some examples, the first ferroelectric memory cell may be configured to operate in a volatile mode (e.g., a DRAM mode), and the second ferroelectric memory cell may be configured to operate in a non-volatile mode (e.g., a FeRAM mode). When determining to access the second memory cell, the method may continue at block 2010. When determining to not access the second memory cell, the method may continue at block 2020. In some examples, the operation(s) at block 2005 may be performed using the memory controller 140 described with reference to FIGS. 1, 3, and 18.

At block 2010 or 2020, the method may include operating a transfer gate based at least in part on determining to read the second memory cell of the second memory cell array. The transfer gate may be configured to selectively couple a second digit line coupled to the second memory cell to the paging buffer register through the first digit line, as described with reference to FIGS. 4, 5, 11, 16, and 17. At block 2010, the method may include closing the transfer gate, to couple the second digit line to the paging buffer register through the first digit line. At block 2020, the method may include opening the transfer gate, to decouple the second digit line from the paging buffer register. In some examples, the operation(s) at block 2010 or 2020 may be performed using the memory controller 140 described with reference to FIGS. 1, 3, and 18.

At block 2015, after closing the transfer gate, the method may include transferring a data bit between the second memory cell and a processor, or between the second memory cell and the first memory cell. In some examples, the operation(s) at block 2015 may be performed using the memory controller 140 described with reference to FIGS. 1, 3, and 18.

At block 2025, after opening the transfer gate, the method may include transferring a data bit between the first memory cell and the processor. In some examples, the operation(s) at block 2025 may be performed using the memory controller 140 described with reference to FIGS. 1, 3, and 18.

It should be noted that methods 1900 and 2000 describes possible implementations, and the operations and steps of the methods 1900 and 2000 may be rearranged or otherwise modified such that other implementations are possible. In some examples, aspects of the methods 1900 and 2000 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of operating a memory device, comprising:
    determining whether to access a first memory cell of a first memory cell array or a second memory cell of a second memory cell array, wherein a first digit line coupled to the first memory cell is coupled to a paging buffer register comprising a sense amplifier; and
    operating a transfer gate based at least in part on determining to read the second memory cell of the second memory cell array, wherein the transfer gate is configured to selectively couple a second digit line coupled to the second memory cell to the paging buffer register through the first digit line, wherein the first memory cell comprises a first ferroelectric memory cell and the second memory cell comprises a second ferroelectric memory cell.

2. The method of claim 1, wherein the first ferroelectric memory cell is configured to operate in a volatile mode and the second ferroelectric memory cell is configured to operate in a non-volatile mode.

3. The method of claim 1, wherein operating the transfer gate comprises:
    closing the transfer gate when determining to access the second memory cell, to couple the second digit line to the paging buffer register through the first digit line.

4. The method of claim 3, further comprising:
    transferring a data bit, after closing the transfer gate, at least one of: between the second memory cell and a data processor, or between the second memory cell and the first memory cell.

5. The method of claim 1, wherein operating the transfer gate comprises:
    opening the transfer gate when determining to not access the second memory cell.

6. A method of operating a memory device, comprising:
    determining whether to access a first memory cell of a first memory cell array or a second memory cell of a second memory cell array, wherein a first digit line coupled to the first memory cell is coupled to a paging buffer register comprising a sense amplifier, wherein the first digit line is coupled to a first plurality of memory cells including the first memory cell; and
    operating a transfer gate based at least in part on determining to read the second memory cell of the second memory cell array, wherein the transfer gate is configured to selectively couple a second digit line coupled to the second memory cell to the paging buffer register through the first digit line, wherein the second digit line is coupled to a second plurality of memory cells including the second memory cell, and wherein the first plurality of memory cells comprises fewer memory cells than the second plurality of memory cells.

7. A method of operating a memory device, comprising:
    determining whether to access a first memory cell of a first memory cell array or a second memory cell of a second memory cell array, wherein a first digit line coupled to the first memory cell is coupled to a paging buffer register comprising a sense amplifier;
    operating a transfer gate based at least in part on determining to read the second memory cell of the second memory cell array, wherein the transfer gate is configured to selectively couple a second digit line coupled to the second memory cell to the paging buffer register through the first digit line; and
    operating the first memory cell array as an embedded cache for the second memory cell array.

8. A method of operating a memory device, comprising:
    determining whether to access a first memory cell of a first memory cell array or a second memory cell of a second memory cell array, wherein a first digit line coupled to the first memory cell is coupled to a paging buffer register comprising a sense amplifier;
    operating a transfer gate based at least in part on determining to read the second memory cell of the second memory cell array, wherein the transfer gate is configured to selectively couple a second digit line coupled to the second memory cell to the paging buffer register through the first digit line; and
    preventing inversion of a ferroelectric film of a capacitor of the first memory cell by biasing a cell plate of the first memory cell.

9. The method of claim 8, further comprising:
    biasing each cell plate of each memory cell in the second memory cell array to a common voltage.

10. The method of claim 8, further comprising:
    independently biasing a voltage of each cell plate of each memory cell in the second memory cell array.

11. An apparatus, comprising:
    a first memory cell array comprising a first digit line connected to a first plurality of memory cells;
    a second memory cell array comprising a second digit line connected to a second plurality of memory cells;

a paging buffer register comprising a first sense amplifier shared by the first memory cell array and the second memory cell array, wherein the first digit line is coupled to the first sense amplifier; and a first transfer gate operable to selectively couple the second digit line to the first sense amplifier through the first digit line, wherein the first memory cell array comprises a first ferroelectric memory cell and the second memory cell array comprises a second ferroelectric memory cell.

12. The apparatus of claim 11, wherein the first plurality of memory cells comprises fewer memory cells than the second plurality of memory cells.

13. The apparatus of claim 11, wherein the second memory cell array further comprises a third digit line connected to a third plurality of memory cells, wherein the paging buffer register further comprises a second sense amplifier, and wherein the apparatus further comprises:

a third memory cell array comprising a fourth digit line connected to a fourth plurality of memory cells, wherein the second sense amplifier is shared by the third plurality of memory cells and the fourth plurality of memory cells, wherein the fourth digit line is coupled to the second sense amplifier; and a second transfer gate operable to selectively couple the third digit line to the second sense amplifier through the fourth digit line.

14. The apparatus of claim 13, wherein the first plurality of memory cells comprises a first subset of memory cells coupled to eau-pie-de the first digit line and a second subset of memory cells coupled to the first digit line, and wherein the first digit line is coupled to the first sense amplifier between the first subset of memory cells and the second subset of memory cells.

15. The apparatus of claim 11, wherein the first sense amplifier comprises:

a first circuit operable to bias the first digit line to a first voltage prior to reading from the first memory cell array; and a second circuit operable to bias the first digit line and the second digit line to a second voltage prior to reading from the second memory cell array.

16. The apparatus of claim 15, wherein the first sense amplifier comprises:

a third circuit operable to bias the first digit line and the second digit line, in parallel, to the second voltage.

17. The apparatus of claim 16, wherein a cell plate of each memory cell in the second plurality of memory cells is connected to a common voltage rail.

18. The apparatus of claim 11, wherein the first memory cell array comprises a first plurality of ferroelectric memory cells that includes a first ferroelectric memory cell and the second memory cell array comprises a second plurality of ferroelectric memory cells that includes a second ferroelectric memory cell.

19. The apparatus of claim 18, wherein the first plurality of ferroelectric memory cells is configured to operate in a volatile mode and the second plurality of ferroelectric memory cells is configured to operate in a non-volatile mode.

20. An apparatus, comprising:
a first memory cell array comprising a first digit line connected to a first plurality of memory cells;
a second memory cell array comprising a second digit line connected to a second plurality of memory cells;
a paging buffer register comprising a first sense amplifier shared by the first memory cell array and the second memory cell array, wherein the first digit line is coupled to the first sense amplifier;
a first transfer gate operable to selectively couple the second digit line to the first sense amplifier through the first digit line, wherein each of a plurality of access lines is coupled to a first memory cell in a first subset of memory cells and a second memory cell in a second subset of memory cells; and
a first access line of the plurality of access lines is coupled to a functioning memory cell in the first subset of memory cells and a non-functioning memory cell in the second subset of memory cells.

21. A data processing system, comprising:
a processor;
a main memory; and
a memory controller configured to transfer data between the main memory and a data processor, wherein the main memory comprises:
a first memory cell array comprising a first digit line connected to a first plurality of memory cells;
a second memory cell array comprising a second digit line connected to a second plurality of memory cells;
a paging buffer register comprising a first sense amplifier shared by the first memory cell array and the second memory cell array, wherein the first digit line is coupled to the first sense amplifier; and
a first transfer gate operable to selectively couple the second digit line to the first sense amplifier through the first digit line, wherein the first memory cell array comprises a first ferroelectric memory cell and the second memory cell array comprises a second ferroelectric memory cell.

22. The data processing system of claim 21, wherein the first memory cell array is used by the processor as a cache for the second memory cell array.

23. The data processing system of claim 22, wherein the processor issues at least one of: a read command to cause the memory controller to close the transfer gate and transfer data from the second memory cell array to the first memory cell array, or a write command to cause the memory controller to open the transfer gate and transfer data from the first memory cell array to the second memory cell array.

24. A data processing system, comprising:
a processor;
a main memory; and
a memory controller configured to transfer data between the main memory and a data processor, wherein the main memory comprises:
a first memory cell array comprising a first digit line connected to a first plurality of memory cells;
a second memory cell array comprising a second digit line connected to a second plurality of memory cells;
a paging buffer register comprising a first sense amplifier shared by the first memory cell array and the second memory cell array, wherein the first digit line is coupled to the first sense amplifier; and
a first transfer gate operable to selectively couple the second digit line to the first sense amplifier through the first digit line, wherein the processor causes the memory controller to operate the transfer gate and write a first type of data to the first memory cell array, or write a second type of data to the second memory cell array.

* * * * *